(12) United States Patent
Hiyama

(10) Patent No.: US 12,294,287 B2
(45) Date of Patent: May 6, 2025

(54) SEMICONDUCTOR SWITCHING ELEMENT DRIVE CIRCUIT AND SEMICONDUCTOR DEVICE

(71) Applicant: Mitsubishi Electric Corporation, Tokyo (JP)

(72) Inventor: Kazuaki Hiyama, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 177 days.

(21) Appl. No.: 17/756,404

(22) PCT Filed: Feb. 10, 2020

(86) PCT No.: PCT/JP2020/005054
§ 371 (c)(1),
(2) Date: May 24, 2022

(87) PCT Pub. No.: WO2021/161362
PCT Pub. Date: Aug. 19, 2021

(65) Prior Publication Data
US 2023/0006552 A1 Jan. 5, 2023

(51) Int. Cl.
*H02M 1/08* (2006.01)
*H02M 1/00* (2007.01)
(Continued)

(52) U.S. Cl.
CPC .......... *H02M 1/08* (2013.01); *H02M 1/0029* (2021.05); *H02M 3/157* (2013.01); *H10D 62/8325* (2025.01)

(58) Field of Classification Search
CPC ...... H02M 1/08; H02M 1/0029; H02M 3/157; H01L 29/1608
See application file for complete search history.

(56) References Cited

U.S. PATENT DOCUMENTS

| 2010/0118455 A1* | 5/2010 | Kusunoki | ............. H01L 29/404 |
| | | | 257/E27.071 |
| 2013/0181640 A1* | 7/2013 | Fukuta | ................ H02M 7/5387 |
| | | | 327/109 |
| 2015/0311692 A1 | 10/2015 | Hiyama | |

FOREIGN PATENT DOCUMENTS

| CN | 104885320 A | 9/2015 |
| GB | 2533677 A | 6/2016 |

(Continued)

OTHER PUBLICATIONS

An Office Action; "Notice of Reasons for Refusal," mailed by the Japanese Patent Office on Mar. 22, 2023, which corresponds to Japanese Patent Application No. 2021-577718 and is related to U.S. Appl. No. 17/756,404; with English language translation.

(Continued)

*Primary Examiner* — Jue Zhang
(74) *Attorney, Agent, or Firm* — Studebaker Brackett PLLC

(57) ABSTRACT

An object is to provide a technique capable of bringing a switching time point of a gate drive condition close to an appropriate switching time point. A semiconductor switching element drive circuit includes a logic circuit that inverts a level of an output signal based on a divided voltage of an output voltage of a semiconductor switching element, and a switching circuit. The switching circuit switches a gate drive condition of the semiconductor switching element during a turn-off operation from a first gate drive condition to a second gate drive condition in which a switching speed is lower than that of the first gate drive condition based on the output signal from the logic circuit.

11 Claims, 32 Drawing Sheets

(51) Int. Cl.
  *H02M 3/157*    (2006.01)
  *H10D 62/832*   (2025.01)

(56) References Cited

FOREIGN PATENT DOCUMENTS

| | | |
|---|---|---|
| JP | 2002-111462 A | 4/2002 |
| JP | 2008-078816 A | 4/2008 |
| JP | 4991446 B2 | 8/2012 |
| JP | 2013-143882 A | 7/2013 |
| JP | 2016-086490 A | 5/2016 |
| JP | 2018088728 A * | 6/2018 |
| WO | 2015/181682 A1 | 12/2015 |

OTHER PUBLICATIONS

International Search Report issued in PCT/JP2020/005054; mailed Mar. 24, 2020.
An Office Action; mailed by the China National Intellectual Property Administration of the People's Republic of China on Mar. 12, 2025, which corresponds to Chinese U.S. Appl. No. 17/756,404.8 and is related to U.S. Appl. No. 17/756,404.

* cited by examiner

F I G. 1
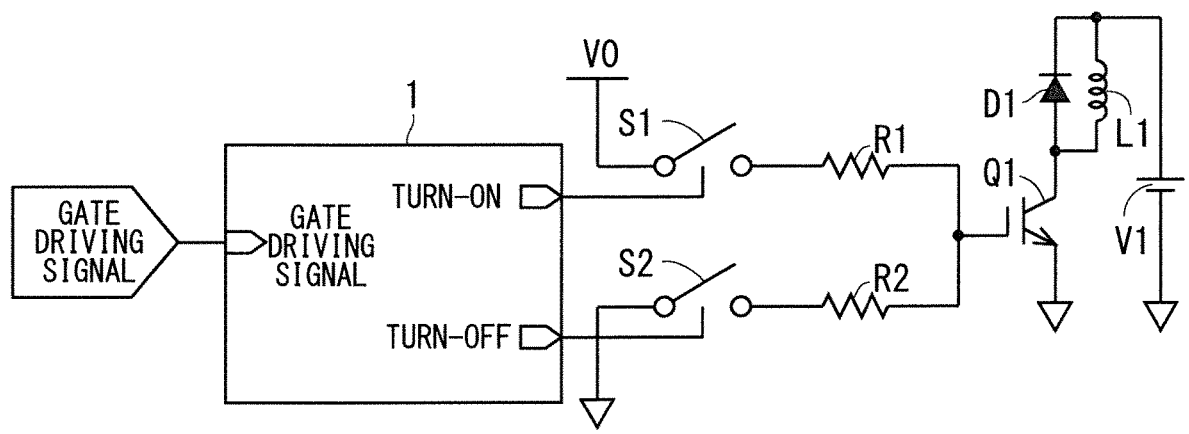

F I G. 3
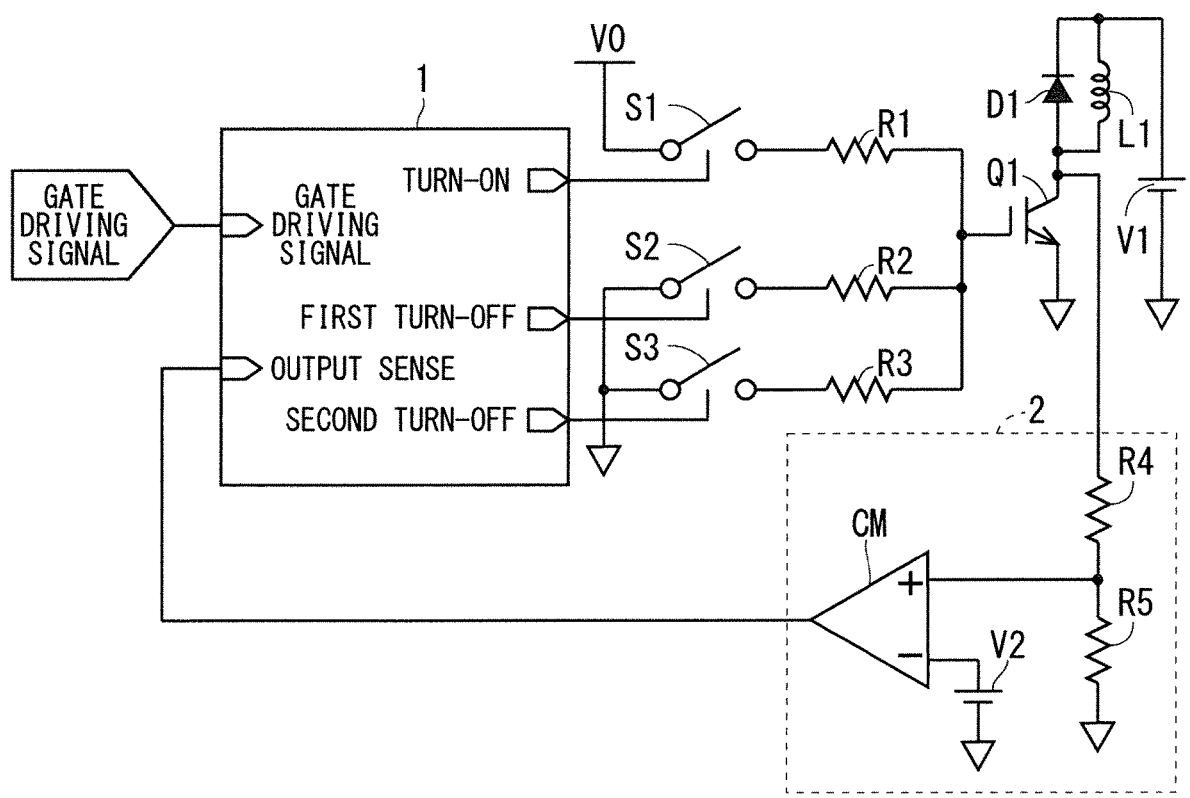

F I G. 7
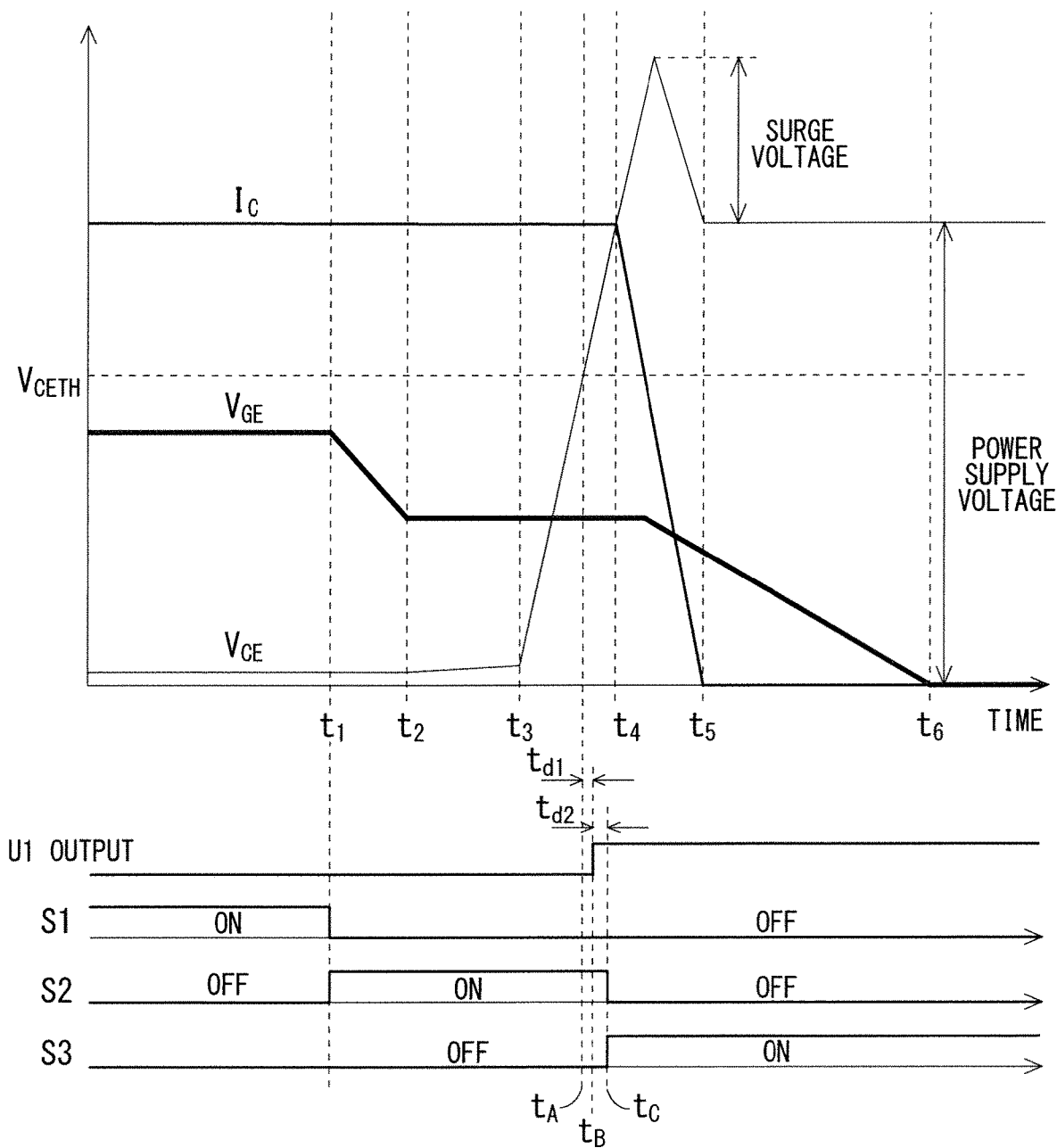

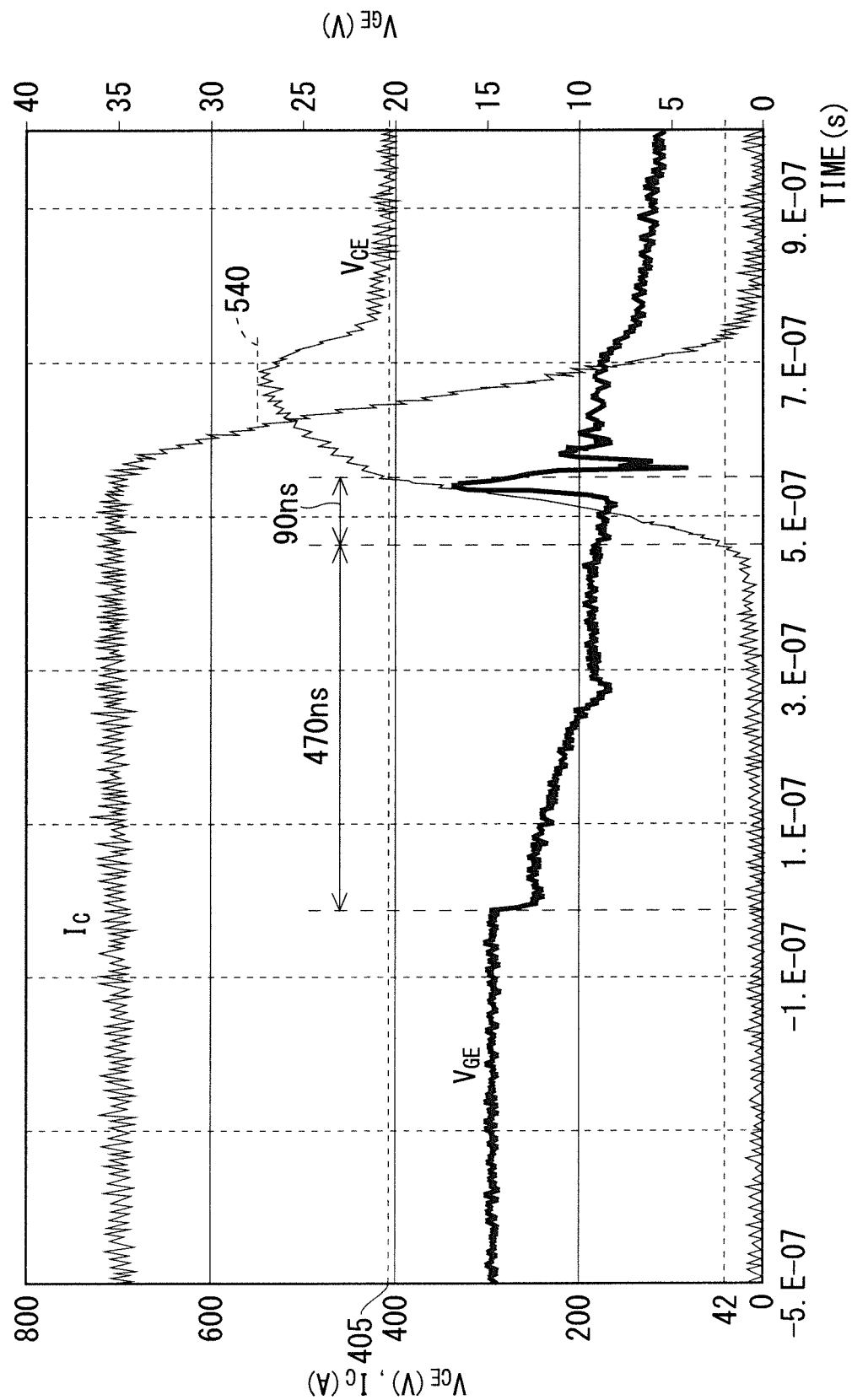
F I G. 9

F I G. 1 2
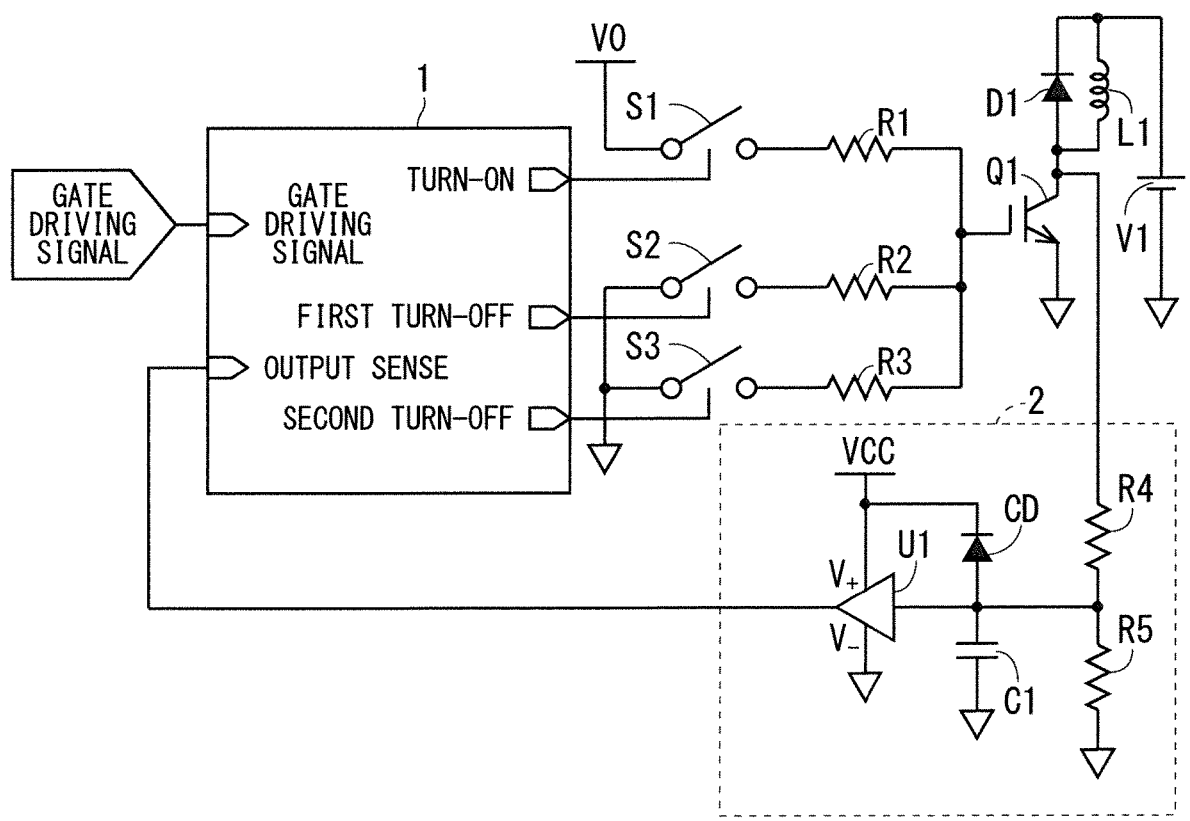

F I G. 1 4
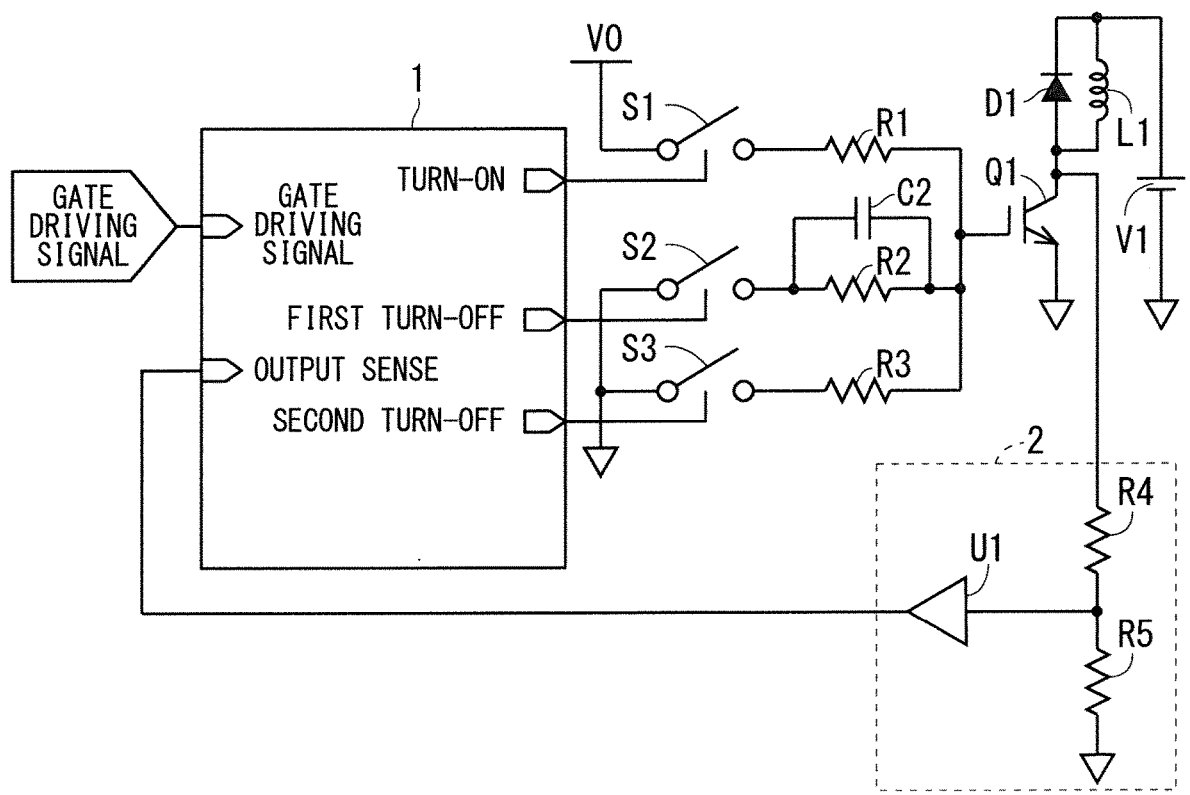

F I G. 1 7
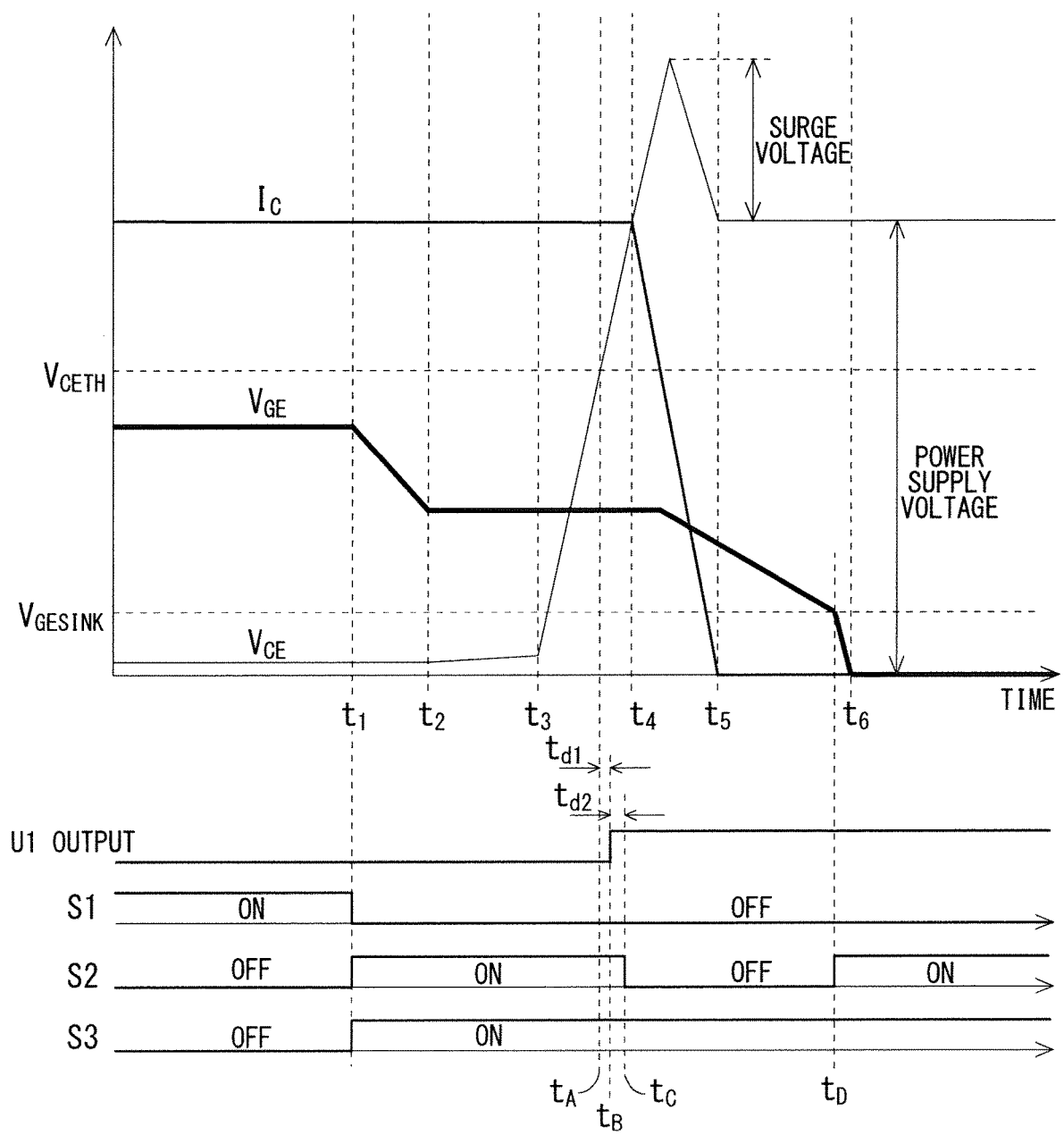

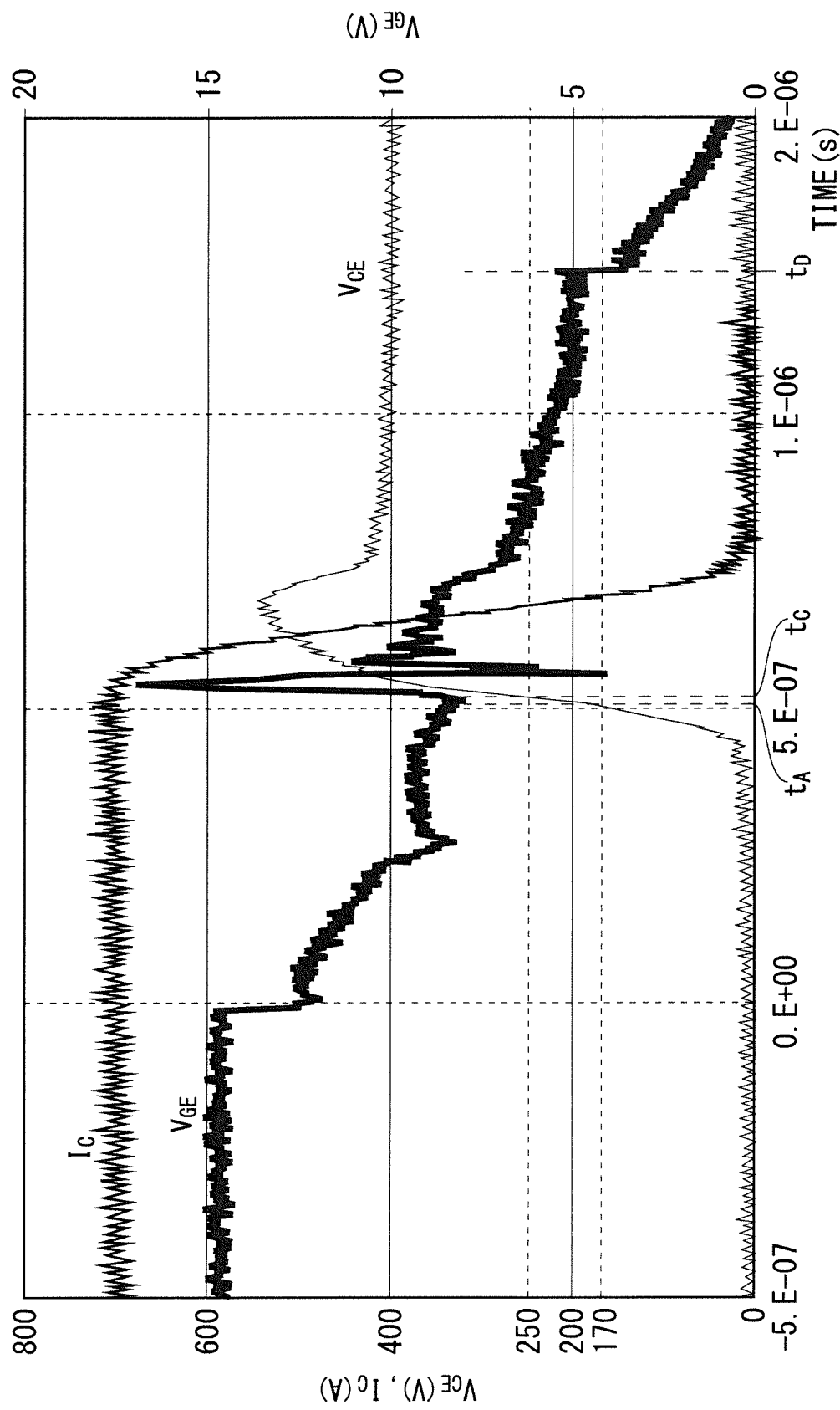

F I G. 1 9
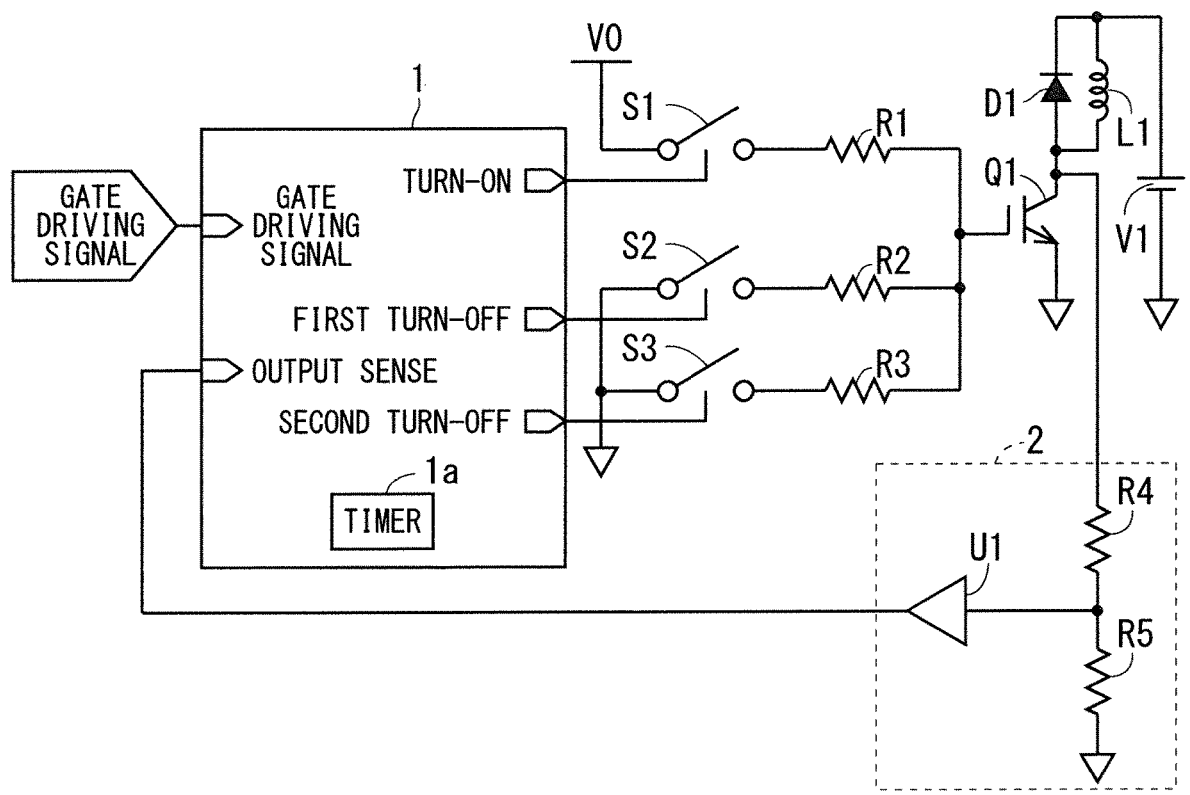

F I G. 2 5
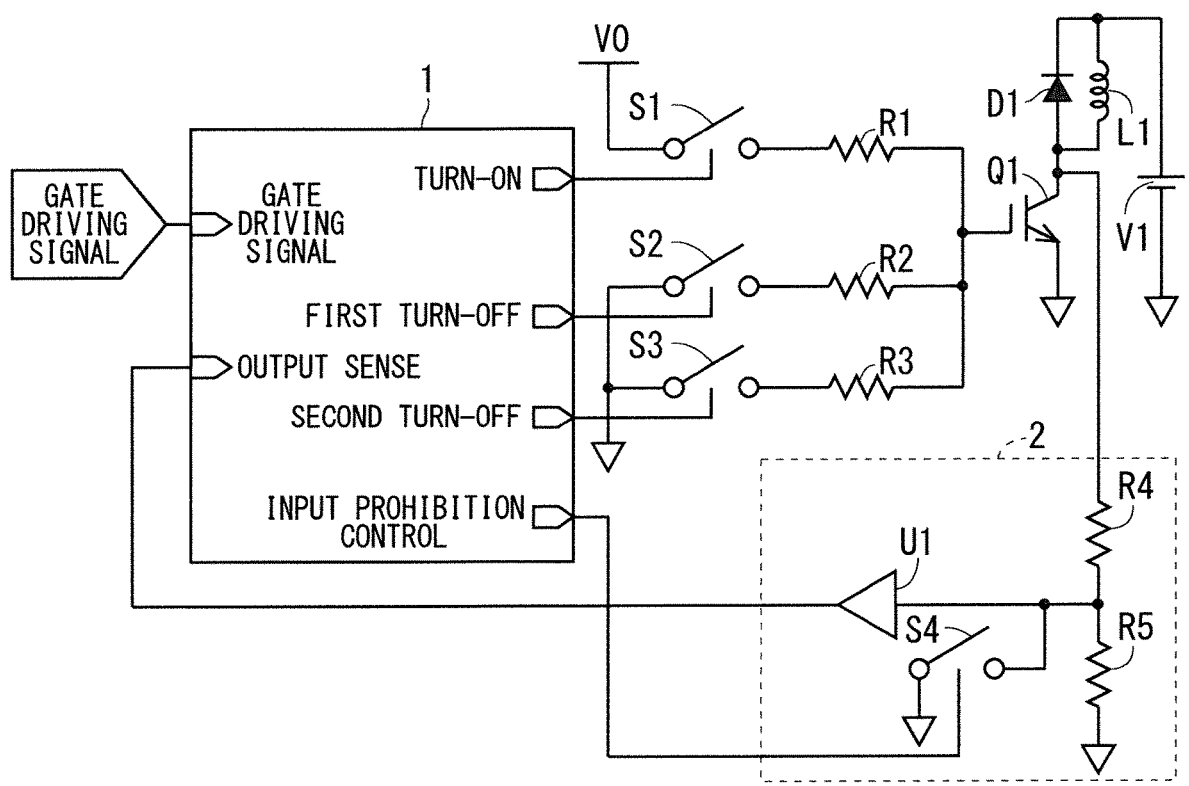

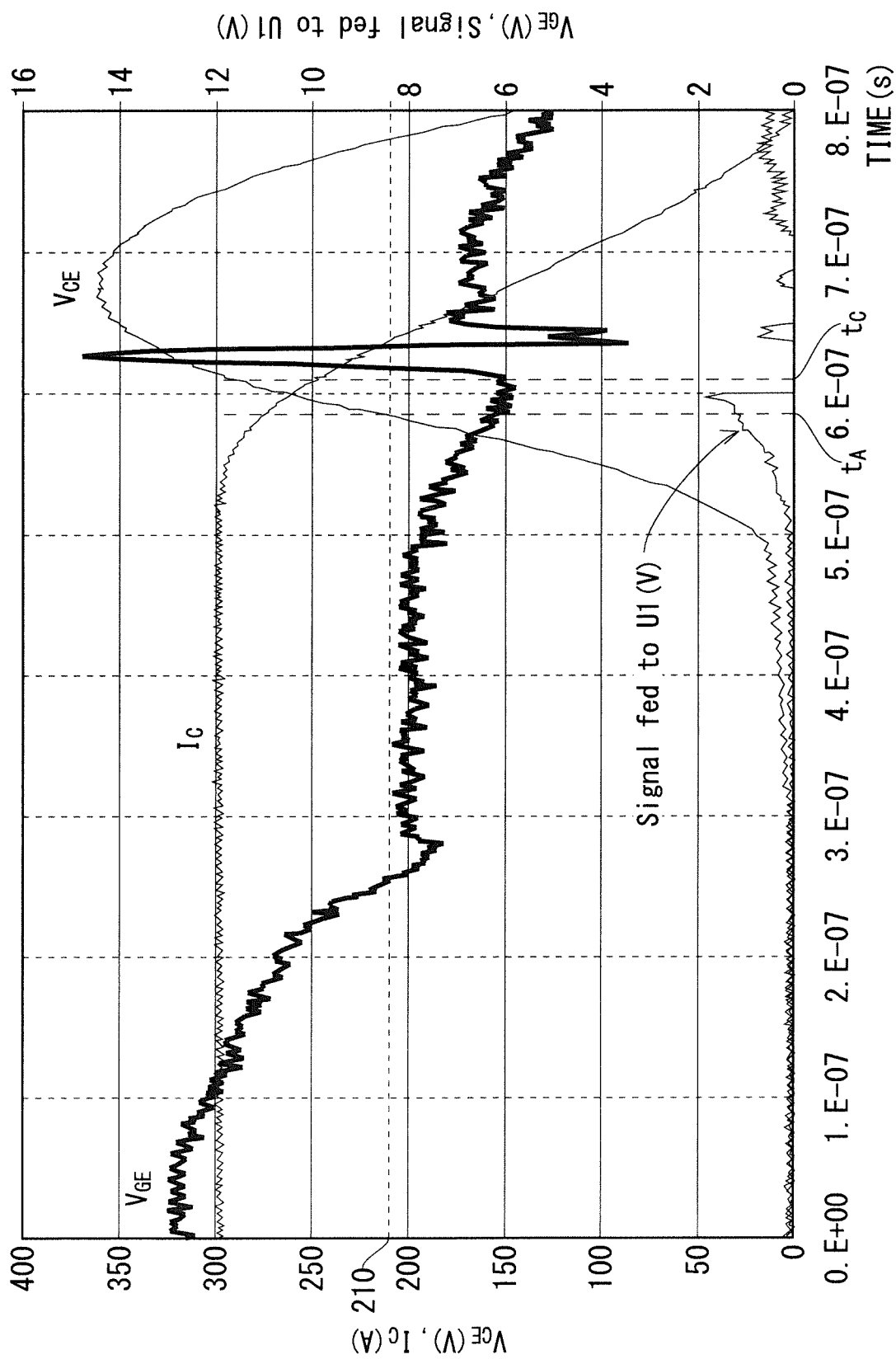
F I G. 28

F I G. 2 9
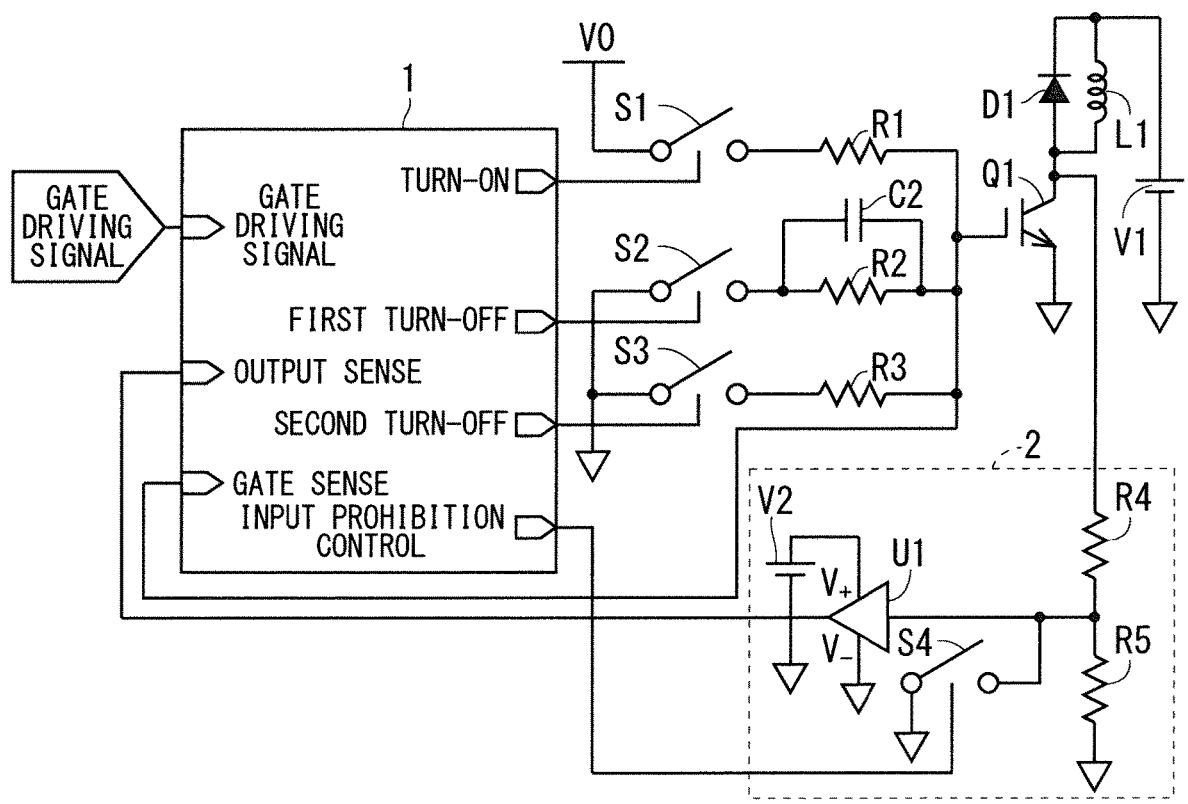

SEMICONDUCTOR SWITCHING ELEMENT DRIVE CIRCUIT AND SEMICONDUCTOR DEVICE

TECHNICAL FIELD

The present disclosure relates to a semiconductor switching element drive circuit and a semiconductor device.

BACKGROUND ART

During a turn-off operation of a semiconductor switching element used in an inverter or the like, a switching loss and a surge voltage occur. When the switching speed of the semiconductor switching element is high, the switching loss can be reduced, but there is a problem that the surge voltage increases. On the other hand, when the switching speed of the semiconductor switching element is low, the surge voltage can be reduced, but there is a problem that the switching loss increases.

In order to reduce the switching loss and the surge voltage having such a trade-off relationship, for example, Patent Document 1 and Patent Document 2 propose a technique of switching the switching speed of the semiconductor switching element during the turn-off operation of the semiconductor switching element.

PRIOR ART DOCUMENTS

Patent Documents

Patent Document 1: Japanese Patent No. 4991446
Patent Document 2: Japanese Patent Application Laid-Open No. 2013-143882

SUMMARY

Problem to be Solved by the Invention

The switching time point at which the switching speed is switched during the turn-off operation of the semiconductor switching element is preferably brought close to an appropriate switching time point such as a current decrease time point at which the output current of the semiconductor switching element starts to decrease, for example. However, in the conventional technique, since the propagation delay time of the analog comparator included in the switching circuit for switching the switching speed is relatively large, there has been a problem that the switching time point cannot be brought close to an appropriate switching time point.

Thus, the present disclosure has been made in view of the above problems, and an object of the present disclosure is to provide a technique capable of bringing a switching time point of a gate drive condition close to an appropriate switching time point.

Means to Solve the Problem

A semiconductor switching element drive circuit according to the present disclosure is a semiconductor switching element drive circuit configured to drive a semiconductor switching element, the semiconductor switching element drive circuit including: a voltage-dividing resistor configured to generate a divided voltage of an output voltage of the semiconductor switching element; a logic circuit configured to invert a level of an output signal based on the divided voltage; and a switching circuit configured to switch a gate drive condition of the semiconductor switching element during a turn-off operation from a first gate drive condition in which a switching speed of the semiconductor switching element is a first switching speed to a second gate drive condition in which the switching speed is a second switching speed lower than the first switching speed based on the output signal from the logic circuit.

Effects of the Invention

The present disclosure includes a logic circuit that inverts a level of an output signal based on a divided voltage of an output voltage of a semiconductor switching element. According to this configuration, the switching time point of the gate drive condition can be brought close to an appropriate switching time point.

Objects, features, aspects, and advantages of the present disclosure will become more apparent from the following detailed description and the accompanying drawings.

BRIEF DESCRIPTION OF DRAWINGS

FIG. 1 is a circuit diagram showing a configuration of a first related circuit.

FIG. 3 is a circuit diagram showing a configuration of a second related circuit.

FIG. 7 is a diagram showing a waveform example during a turn-off operation by the semiconductor switching element drive circuit according to the first embodiment.

FIG. 9 is a diagram showing an actual measured waveform during a turn-off operation by the semiconductor switching element drive circuit according to the first embodiment.

FIG. 12 is a circuit diagram showing a configuration of a semiconductor switching element drive circuit according to a fourth embodiment.

FIG. 14 is a circuit diagram showing a configuration of a semiconductor switching element drive circuit according to a fifth embodiment.

FIG. 17 is a diagram showing another waveform example during a turn-off operation by the semiconductor switching element drive circuit according to the sixth embodiment.

FIG. 18 is a diagram showing an actual measured waveform during a turn-off operation by the semiconductor switching element drive circuit according to the sixth embodiment.

FIG. 19 is a circuit diagram showing a configuration of a semiconductor switching element drive circuit according to a seventh embodiment.

FIG. 25 is a circuit diagram showing a configuration of a semiconductor switching element drive circuit according to a ninth embodiment.

FIG. 28 is a diagram showing an actual measured waveform during a turn-off operation by the semiconductor switching element drive circuit according to the ninth embodiment.

FIG. 29 is a circuit diagram showing a configuration of a semiconductor switching element drive circuit according to a tenth embodiment.

DESCRIPTION OF EMBODIMENTS

First, before describing a semiconductor switching element drive circuit (hereinafter, also may be abbreviated as a "drive circuit") according to an embodiment of the present disclosure, first and second semiconductor switching element drive circuits related thereto (hereinafter, referred to as "first and second related circuits") will be described.

<Related Circuit>

FIG. 1 is a circuit diagram showing a configuration of a first related circuit.

A diode D1 and an inductive load L1 are connected in parallel between the semiconductor switching element Q1 driven by the first related circuit and the power supply V1.

The diode D1 has a function of freewheeling the load current when the semiconductor switching element Q1 is turned off. The load L1 is supplied with power by the power supply V1.

The first related circuit includes a control unit 1, switches S1 and S2, and gate resistors R1 and R2.

The switch S1 and the gate resistor R1 are connected in series between the power supply V0 (15 V as an example) and the gate of the semiconductor switching element Q1. The switch S2 and the gate resistor R2 are connected in series between a potential (ground potential in FIG. 1) lower than the power supply and the gate of the semiconductor switching element Q1. The switch S1 and the switch S2 may be, for example, semiconductor switching elements or the like, or may be elements other than these.

The control unit 1 controls on and off of the switch S1 and the switch S2 based on the gate driving signal. When the switch S1 is turned on and the switch S2 is turned off by the control unit 1, the gate of the semiconductor switching element Q1 is electrically connected to the power supply and the gate resistor R1, and the semiconductor switching element Q1 is turned on. When the switch S2 is turned on and the switch S1 is turned off by the control unit 1, the gate of the semiconductor switching element Q1 is electrically connected to the ground potential and the gate resistor R2, and the semiconductor switching element Q1 is turned off.

The gate resistor R1 and the gate resistor R2 are used as means for setting a gate drive condition for adjusting the switching characteristics during the turn-on operation and the turn-off operation of the semiconductor switching element Q1 to respective appropriate characteristics. For example, the switching speed during the turn-off operation of the semiconductor switching element Q1 decreases as the gate resistance value of the gate resistor R2 increases, and increases as the gate resistance value of the gate resistor R2 decreases.

Figure 2:
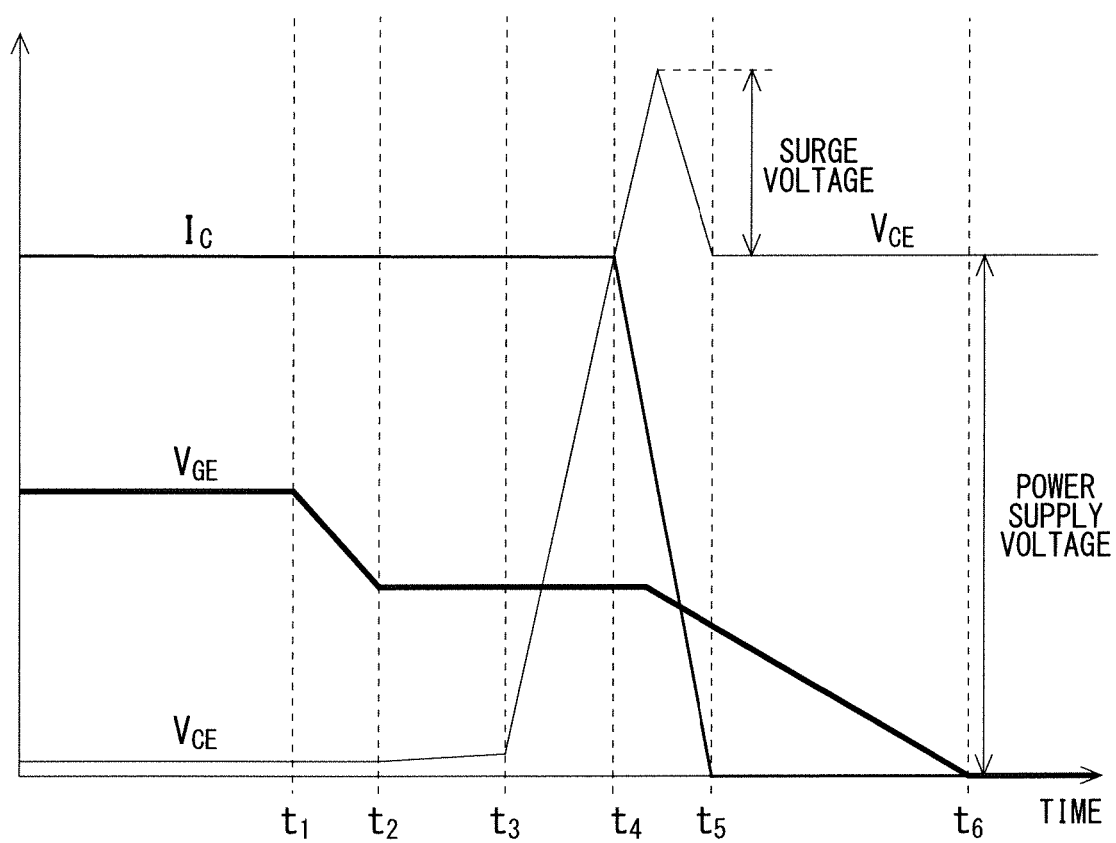
FIG. 2 is a diagram showing a waveform example during a turn-off operation by the first related circuit.

FIG. 2 is a diagram showing a waveform example at the time of turn-off operation of the semiconductor switching element Q1 by the driving of the first related circuit. The $t_1$ is a time point at which the gate driving signal is turned off and the gate voltage ($V_{GE}$) starts to decrease. The $t_2$ is a time point at which the output voltage ($V_{CE}$) being the collector voltage starts to gently increase, and the gate voltage ($V_{GE}$) stops falling to be a constant voltage (Miller period voltage). The $t_3$ is a time point at which the output voltage ($V_{CE}$) starts to increase rapidly. The $t_4$ is a time point at which the output voltage ($V_{CE}$) reaches the power supply voltage and the output current ($I_C$) starts to decrease. The $t_5$ is a time point at which the output current ($I_C$) becomes zero. The $t_6$ is a time point at which the gate voltage ($V_{GE}$) becomes zero.

As shown in FIG. 2, during the turn-off operation of the semiconductor switching element Q1, the output voltage ($V_{CE}$) increases to the power supply voltage in a period $t_3$ to $t_4$, and the output current ($I_C$) decreases in a period $t_4$ to $t_5$. During a period $t_3$ to $t_5$ including these periods, a switching loss based on the output voltage×the output current occurs. On the other hand, in a period $t_4$ to $t_5$ in which the output current decreases, a surge voltage due to a parasitic inductance of an output current path such as the load L1 occurs in the output voltage ($V_{CE}$).

Since the switching loss causes heat generation of the semiconductor switching element Q1 and the like, it is preferable that the switching loss is low. The surge voltage is preferably low because the sum of the surge voltage and the power supply voltage needs to be suppressed to be equal to or less than the withstand voltage of the semiconductor switching element Q1 or the like.

Here, when the resistance value of the turn-off gate resistor R2 in FIG. 1 is lowered, the switching speed during the turn-off operation of the semiconductor switching element Q1 increases, the period $t_3$ to $t_5$ in FIG. 2 are shortened, and the switching loss is reduced. However, since the change rate ($\Delta I_C/\Delta t$) of the output current ($I_C$) of the semiconductor switching element Q1 in a period $t_4$ to $t_5$ in FIG. 2 increases, the surge voltage ($=L \times \Delta I_C/\Delta t$) generated by the parasitic inductance L of the output current path increases.

Conversely, when the resistance value of the turn-off gate resistor R2 is increased, the surge voltage decreases, but the switching loss increases. As described above, the switching loss and the surge voltage are in a trade-off relationship.

In addition, the length of the period $t_1$ to $t_4$ in FIG. 2, that is, the length of the period td (off) from the start of the turn-off operation to the start of the decrease in the output current ($I_C$) is also affected by the gate drive condition and eventually the resistance value of the gate resistor R2. Specifically, when the resistance value of the gate resistor R2 is lowered, the period td (off) is shortened, and when the resistance value of the gate resistor R2 is raised, the period td (off) is lengthened. Therefore, the period td (off) has a trade-off relationship with the surge voltage similarly to the switching loss.

Next, it will be described that it is preferable that the period td (off) is shorter. In the bridge configuration including the semiconductor switching elements connected in series, in order to prevent a short circuit in which the upper and lower semiconductor switching elements are simultaneously turned on, after a certain period of time ($t_{dead}$) since the start of turn-off operation of one of the semiconductor switching elements, the turn-on operation of the other is started. When the period td (off) becomes longer, the period ($t_{dead}$) also needs to be made longer accordingly. However, when the period ($t_{dead}$) becomes longer, the effective output voltage decreases when the H-bridge, the three-phase inverter, or the like is configured. In order to suppress the decrease in the effective output voltage, it is preferable that the period td (off) is short.

FIG. 3 is a circuit diagram showing a configuration of a second related circuit. Hereinafter, among the components related to the second related circuit, the components identical or similar to the above-described components will be denoted by the identical or similar reference numerals, and different components will be mainly described. As described below, according to the second related circuit, it is possible to achieve reduction in the surge voltage having a trade-off relationship with the switching loss and the period td (off) while achieving reduction in the switching loss and shortening of the period td (off).

The second related circuit is similar to a circuit in which the switch S3, the gate resistor R3, the voltage-dividing resistors R4 and R5, and the analog comparator CM are added to the first related circuit described above. Similarly to the switch S2 and the gate resistor R2, the switch S3 and the gate resistor R3 are connected in series between a potential (ground potential in FIG. 3) lower than the power supply and the gate of the semiconductor switching element Q1. Here, the description will be given assuming that the resistance value of the gate resistor R3 is larger than the resistance value of the gate resistor R2.

The voltage-dividing resistors R4 and R5 generate a divided voltage of the output voltage ($V_{CE}$) of the semiconductor switching element Q1. The analog comparator CM outputs a comparison signal indicating whether the divided voltage exceeds a predetermined threshold value to the control unit 1. According to this configuration, substantially, the comparison signal indicating whether or not the output voltage ($V_{CE}$) of the semiconductor switching element Q1 exceeds the threshold value is output to the control unit 1.

The control unit 1 controls on and off of the switches S1 to S3 based on the gate driving signal and the comparison signal from the analog comparator CM. In particular, when receiving the comparison signal indicating that the output voltage ($V_{CE}$) exceeds the threshold value during the turn-off operation of the semiconductor switching element Q1, the control unit 1 switches the switches S2 and S3 so that the resistance value of the gate resistor of the semiconductor switching element Q1 increases. That is, the control unit 1 switches the gate resistor from the gate resistor R2 to the gate resistor R3 having a resistance value larger than that of the gate resistor R2 during the turn-off operation of the semiconductor switching element Q1, thereby switching to the gate drive condition in which the switching speed decreases.

An appropriate switching time point at which the gate drive condition is switched is $t_4$ in FIG. 2. Before $t_4$ during the turn-off operation, the control unit 1 decreases the gate resistance value to increase the switching speed, so that the period td (off) can be shortened and the switching loss in the period $t_3$ to $t_4$ in which the output voltage ($V_{CE}$) increases can be reduced. On the other hand, after $t_4$ during the turn-off operation, the control unit 1 increases the gate resistance value to reduce the switching speed, so that the surge voltage can be reduced during the period $t_4$ to $t_5$. According to the second related circuit configured as described above, it is possible to achieve reduction in the surge voltage having a trade-off relationship with the switching loss and the period td (off) while achieving reduction in the switching loss and shortening of the period td (off).

When the switching time point of the gate drive condition is greatly delayed from $t_4$ at which the output voltage ($V_{CE}$) reaches the power supply voltage and the output current ($I_C$) starts to decrease, the surge voltage increases. On the other hand, when the switching time point of the gate drive condition is greatly advanced from $t_4$, the switching loss increases in the period $t_3$ to $t_4$ in which the output voltage ($V_{CE}$) increases. Therefore, it is important to bring the switching time point of the gate drive condition close to $t_4$.

Figure 4:
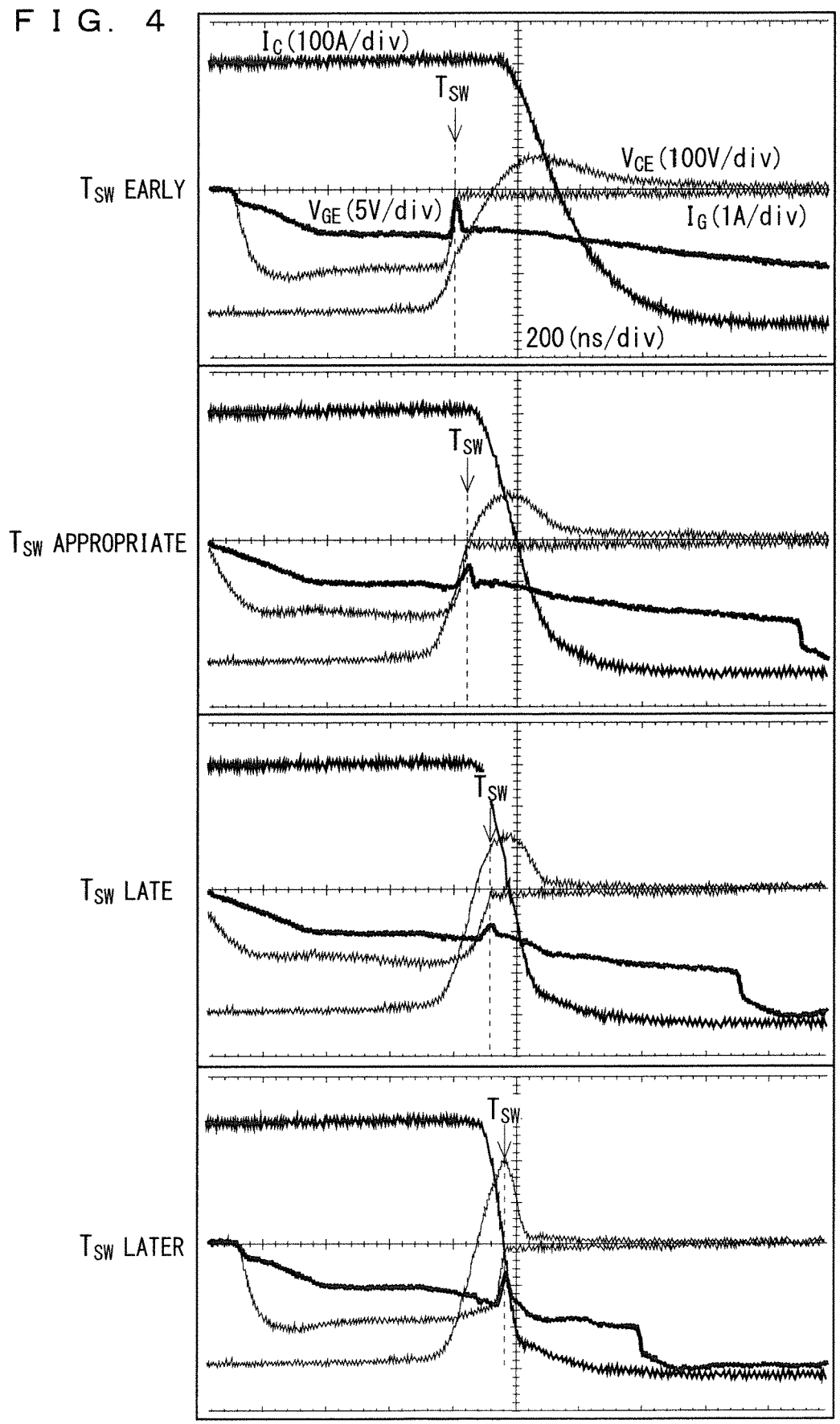
FIG. 4 is a diagram showing an actual measured waveform during a turn-off operation by the second related circuit.

FIG. 4 is a diagram showing an actual measured waveform indicating the influence of the switching time point of the gate drive condition. In the first diagram from the top in FIG. 4, the switching time point $T_{SW}$ of the gate drive condition is about 50 ns earlier than $t_4$, and in the second diagram from the top, the switching time point $T_{SW}$ of the gate drive condition is substantially the same as $t_4$. In the third diagram from the top, the switching time point $T_{SW}$ of the gate drive condition is about 50 ns later than $t_4$, and in the fourth diagram from the top, the switching time point $T_{SW}$ of the gate drive condition is about 100 ns later than $t_4$. In the example in FIG. 4, the switching time point $T_{SW}$ of the gate drive condition is preferably switched to within ±50 ns from $t_4$.

Here, in the second related circuit, the threshold value of the output voltage ($V_{CE}$) is determined in consideration of the total delay time of the control circuit (hereinafter referred to as "gate drive condition switching circuit") including the analog comparator CM and the like for switching the gate drive condition. Here, in general, the propagation delay time from when the input signal of the analog comparator exceeds the threshold value until the output signal of the analog comparator is inverted is several hundred ns to several μs, and the total delay time of the gate drive condition switching circuit is longer than the propagation delay time.

Here, in the following (1) to (3), the reason why the total delay time of the gate drive condition switching circuit and eventually the propagation delay time of the analog comparator CM should be shortened will be described.

(1) When the gate resistance value is reduced in order to reduce the switching loss during the rise time ($t_3$ to $t_4$ in FIG. 2) of the output voltage ($V_{CE}$), the rise time ($t_3$ to $t_4$ in FIG. 2) of the output voltage ($V_{CE}$) is shortened. In such a case, the shorter the total delay time of the gate drive condition switching circuit, the higher the threshold value voltage of the output voltage ($V_{CE}$) of the semiconductor switching element Q1 can be set, and variations in operation timing due to external noise can be reduced. Therefore, the total delay time of the gate drive condition switching circuit and eventually the propagation delay time of the analog comparator CM should be shortened.

(2) When the rise time of the output voltage ($V_{CE}$) fluctuates due to the characteristic variations of the semiconductor switching element Q1, the deviation between the gate drive condition switching time point and the appropriate switching time point $t_4$ increases. However, the shorter the total delay time of the gate drive condition switching circuit, the less the influence of the characteristic variations of the semiconductor switching element Q1 can be made. Therefore, in order to enhance the stability and accuracy of the operation of the semiconductor switching element Q1, the total delay time of the gate drive condition switching circuit and eventually the propagation delay time of the analog comparator should be shortened.

Figure 5:
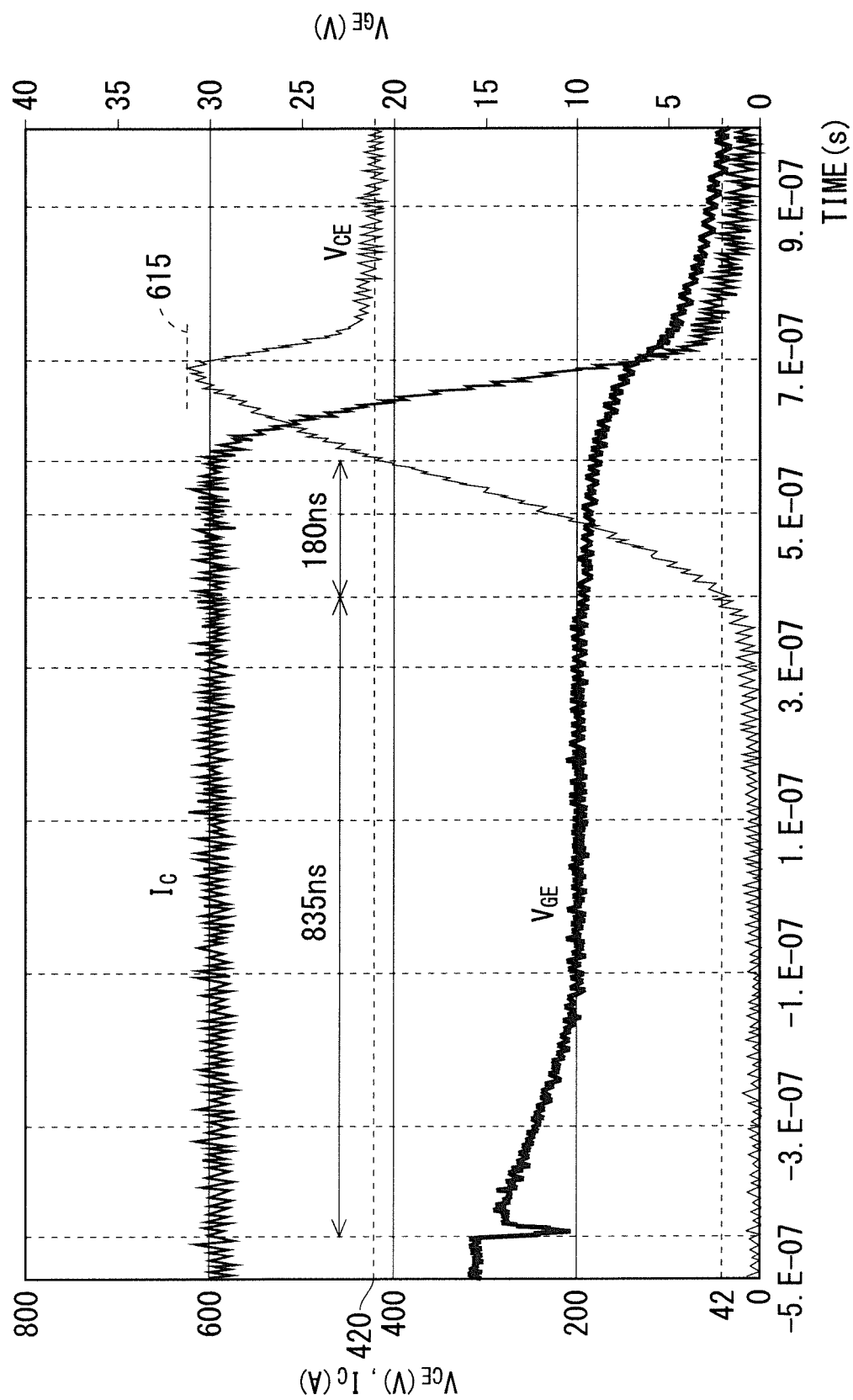
FIG. 5 is a diagram showing an actual measured waveform during a turn-off operation by the first related circuit.

(3) FIG. 5 is a diagram showing an actual measured waveform at the time of the turn-off operation of the semiconductor switching element Q1 in the first related circuit that does not switch the gate drive condition. It should be noted that the semiconductor switching element Q1 is an insulated gate bipolar transistor (IGBT). In the example in FIG. 5, since the gate drive condition is fixed, the turn-off switching speed is adjusted to be small so that the surge voltage occurring at the time of falling of the collector current ($I_C$) falls within the element withstand voltage or less. For this adjustment, the period until the collector voltage ($V_{CE}$) rises from 10% of the power supply voltage to the power supply voltage is 180 ns, which is equal to or slightly shorter than the propagation delay time of a general analog comparator.

On the other hand, in the second related circuit that switches the gate drive condition, the rise time of the collector voltage ($V_{CE}$) can be set to about 90 ns being ½ of the rise time of the first related circuit. However, in order to shorten the rise time of the collector voltage ($V_{CE}$) to this extent, it is necessary to make the total delay time of the gate drive condition switching circuit shorter than this (for example, about 50 ns).

However, since the propagation delay time of a general analog comparator included in the total delay time of the gate drive condition switching circuit is several hundred ns, the total delay time of the gate drive condition switching circuit cannot be sufficiently shortened. As a result, there has been a problem that the switching time point of the gate drive condition cannot be brought close to the appropriate switching time point $t_4$.

It should be noted that although this problem can be solved by using an expensive discrete high-speed comparator, there arises another problem that the cost and the mounting area of the semiconductor switching element drive circuit increase. On the other hand, as described below, according to the semiconductor switching element drive circuit of the present disclosure, the above problem can be solved.

First Embodiment

Figure 6:
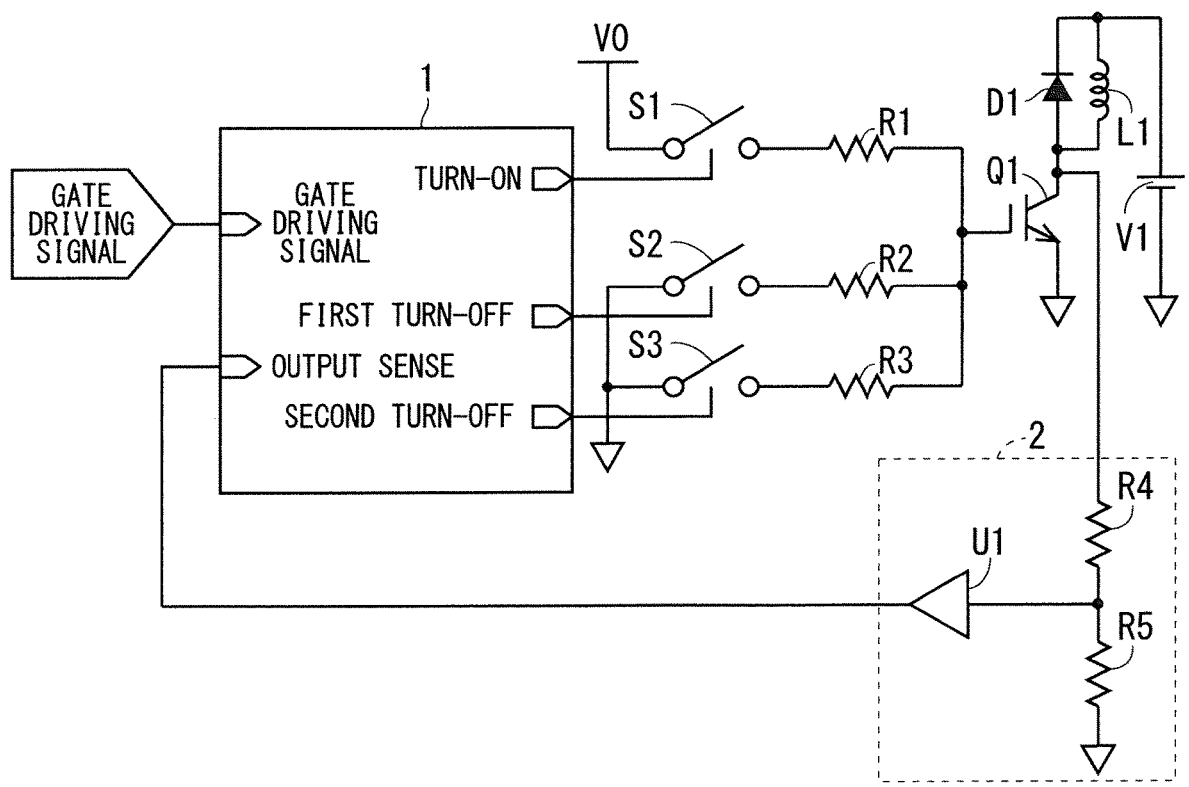
FIG. 6 is a circuit diagram showing a configuration of a semiconductor switching element drive circuit according to a first embodiment.

FIG. 6 is a circuit diagram showing a configuration of the semiconductor switching element drive circuit according to the present first embodiment. Hereinafter, among the components according to the present first embodiment, the components identical or similar to the above-described components will be denoted by the identical or similar reference numerals, and different components will be mainly described.

Similarly to the first related circuit and the second related circuit, the diode D1 and the inductive load L1 are connected in parallel between the semiconductor switching element Q1 driven by the drive circuit according to the present first embodiment and the power supply V1. The semiconductor switching element Q1 preferably includes an IGBT or a metal oxide semiconductor field effect transistor (MOSFET) containing silicon carbide. In particular, when the semiconductor switching element Q1 includes an unipolar MOSFET containing silicon carbide, the turn-off operation becomes relatively fast, so that the switching loss reduction effect can be enhanced.

It should be noted that in the example in FIG. 6, the gate drive voltage source of the semiconductor switching element Q1 is a general 15 V voltage source, but is not limited thereto, and an appropriate voltage source is used according to the gate design condition of the semiconductor switching element Q1.

The drive circuit according to the present first embodiment includes an output voltage detection unit 2 and a switching circuit.

The output voltage detection unit 2 includes voltage-dividing resistors R4 and R5 and a logic circuit U1. The voltage-dividing resistors R4 and R5 constitute a voltage-dividing circuit that generates a divided voltage of the output voltage ($V_{CE}$) of the semiconductor switching element Q1.

The logic circuit U1 inverts the level of the output signal based on the divided voltage generated by the voltage-dividing resistors R4 and R5. The logic circuit U1 is a circuit in which, for example, an input/output signal takes a binary value such as a high/low voltage or a positive/negative voltage and functions as a buffer. The propagation delay time of the logic circuit U1 configured as described above is smaller than the propagation delay time of the analog comparator.

In the present first embodiment, when the output voltage ($V_{CE}$) of the semiconductor switching element Q1 reaches a predetermined threshold voltage ($V_{CETH}$), the logic circuit U1 switches the output signal from the logic circuit U1. It should be noted that the resistance values of the voltage-dividing resistors R4 and R5 (voltage division ratio) are adjusted so that the threshold voltage of the input signal of the logic circuit U1=$V_{CETH} \times (R5/(R4+R5))$) is set. The threshold voltage ($V_{CETH}$) is determined in consideration of an appropriate switching time point ($t_4$) under the gate drive condition and the total delay time of the gate drive condition switching circuit including the propagation delay time of the logic circuit U1.

Similarly to the second related circuit, the switching circuit according to the present first embodiment includes a control unit 1, switches S1 to S3, and gate resistors R1 to R3.

The gate resistor R1 is an on-gate resistor for setting a switching speed during the turn-on operation of the semiconductor switching element Q1. The gate resistors R2 and R3 are off-gate resistors for setting a switching speed during the turn-off operation of the semiconductor switching element Q1.

The control unit 1 controls on and off of the semiconductor switching element Q1 by controlling on and off of the switches S1 to S3 based on the gate driving signal and the output signal from the logic circuit U1. In particular, when the output signal from the logic circuit U1 is switched, that is, when the output voltage ($V_{CE}$) of the semiconductor switching element Q1 substantially reaches a predetermined threshold voltage ($V_{CETH}$), the control unit 1 switches the gate drive condition.

The switching circuit configured as described above switches the gate drive condition of the semiconductor switching element Q1 during the turn-off operation from the first drive condition to the second drive condition based on the output signal from the logic circuit U1. In the present first embodiment, when the gate drive condition of the semiconductor switching element Q1 is the first drive condition, the gate resistor R2 being the first resistor is electrically connected to the gate of the semiconductor switching element Q1. When the gate drive condition of the semiconductor switching element Q1 is the second drive condition, the gate resistor R3 being the second resistor is electrically connected to the gate of the semiconductor switching element Q1.

Here, a case where the resistance value of the gate resistor R3 is larger than the resistance value of the gate resistor R2 will be described. As described above, in general, the switching speed of the semiconductor switching element decreases when the gate resistance value increases. Therefore, adjusting the resistance value of the gate resistor R2 causes the first drive condition to become a drive condition in which the switching speed of the semiconductor switching element Q1 is an appropriate first switching speed. Then, adjusting the resistance value of the gate resistor R3 causes the second drive condition to become a drive condition in which the switching speed of the semiconductor switching element Q1 is the second switching speed lower than the first switching speed. It should be noted that as will be described below, the resistance value of the gate resistor R3 is not limited to be larger than the resistance value of the gate resistor R2.

FIG. 7 is a diagram showing a waveform example during a turn-off operation of the semiconductor switching element Q1 by the drive of the drive circuit according to the present first embodiment. The $t_1$ to $t_6$ in FIG. 7 are similar to $t_1$ to $t_6$ in FIG. 2. The $t_A$ is a time point at which the output voltage ($V_{CE}$) reaches the threshold voltage ($V_{CETH}$) for switching the gate drive condition. The $t_B$ is a time point at which the level of the output signal of the logic circuit U1 of the output voltage detection unit 2 is inverted. The $t_C$ is a time point at which the switch S2 is turned off and the switch S3 is turned on. It should be noted that the switching time point of the gate drive condition is any one time point within $t_B$ to $t_C$. Thus, in the following description, the switching time point of the gate drive condition may be referred to as switching time points $t_B$ and $t_C$. The $t_{d1}$ is a delay time caused by the logic circuit U1, and the $t_{d2}$ is a delay time caused by the control unit 1.

When the gate drive signal is switched from on to off at $t_1$, the switch S1 is switched from on to off, the switch S2 is switched from off to on, and the semiconductor switching element Q1 is started to be turned off under the first drive condition using the gate resistor R2. When the output voltage ($V_{CE}$) at $t_A$ reaches the threshold voltage ($V_{CETH}$), the output signal of the logic circuit U1 is inverted at $t_B$, and the switch S2 is switched from on to off and the switch S3 is switched from off to on at $t_C$. Thus, the gate drive condition of the semiconductor switching element Q1 is switched from the first drive condition using the gate resistor R2 to the second drive condition using the gate resistor R3 having a larger resistance value than the gate resistor R2, and the switching speed decreases. As a result, since the switching speed of the semiconductor switching element Q1 at and after $t_C$ is reduced, the surge voltage can be reduced.

It should be noted that the threshold voltage ($V_{CETH}$) is set in consideration of the delay time of each unit such as $t_{d1}$ and $t_{d2}$ so that the switching time points $t_B$ and $t_C$ of the gate drive condition approach the appropriate switching time point $t_A$.

Figure 8:
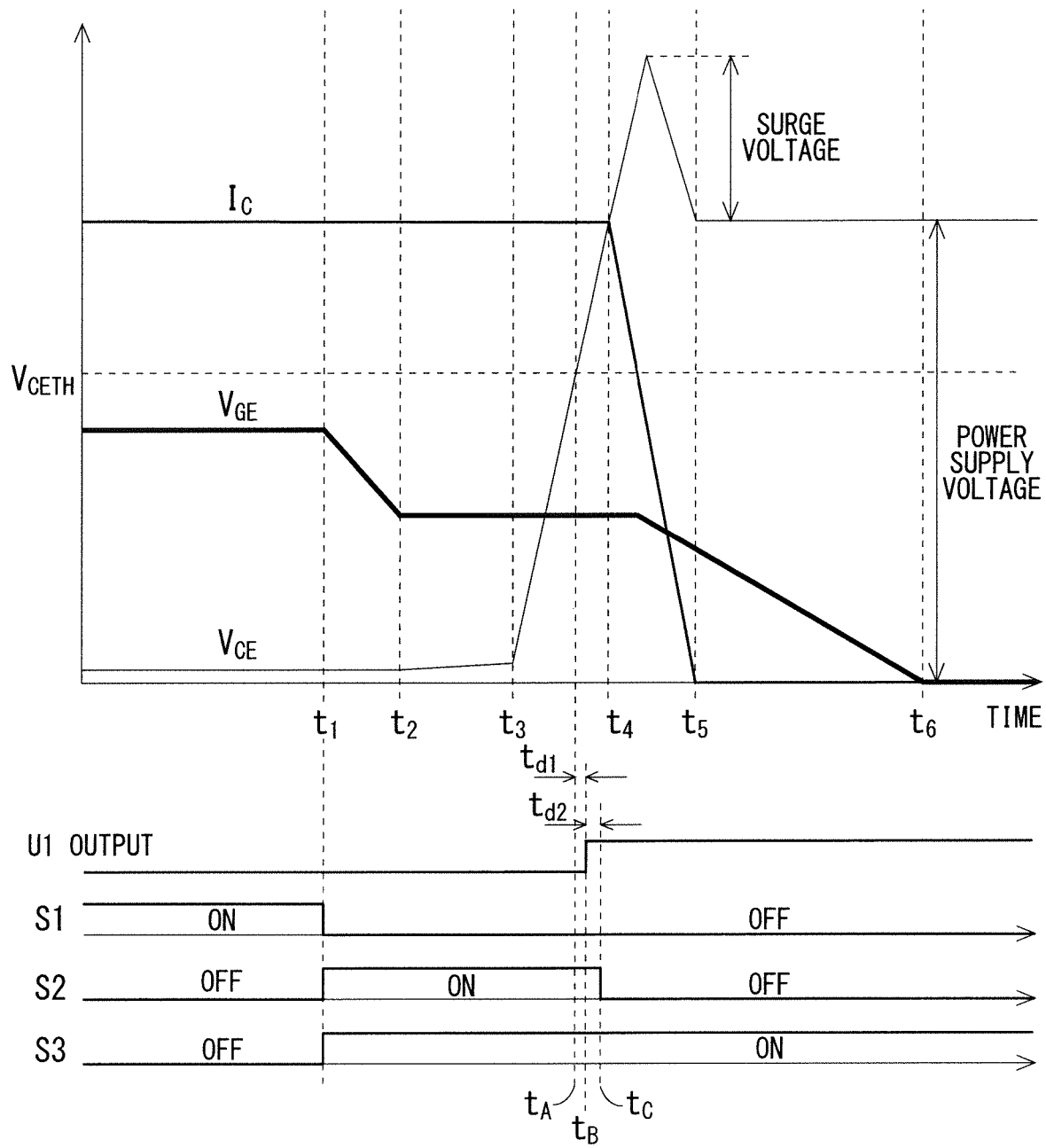
FIG. 8 is a diagram showing another waveform example during a turn-off operation by the semiconductor switching element drive circuit according to the first embodiment.

FIG. 8 is a diagram showing another waveform example during a turn-off operation of the semiconductor switching element Q1 by the drive of the drive circuit according to the present first embodiment. A difference between the waveform in FIG. 7 and the waveform in FIG. 8 is that, in the waveform in FIG. 8, not only the switch S2 but also the switch S3 is turned on in the period $t_1$ to $t_c$. Thus, the off-gate resistance value under the first drive condition in the period $t_1$ to $t_c$ becomes the resistance value of the combined resistance of the gate resistors R2 and R3 (=R2×R3/(R2+R3)), and the off-gate resistance value under the second gate drive condition at and after $t_c$ becomes the resistance value of the resistance of the gate resistors R3 (=R3). R2×R3/(R2+R3)<R3 holds regardless of the resistance values of the gate resistors R2 and R3. Therefore, according to the drive in FIG. 8, regardless of the magnitude relationship between the resistance values of the gate resistors R2 and R3, switching between the first drive condition and the second drive condition can be performed, and the surge voltage can be reduced.

FIG. 9 is a diagram showing an actual measured waveform during a turn-off operation of the semiconductor switching element Q1 by the drive of the drive circuit according to the present first embodiment. It should be noted that the semiconductor switching element Q1 is an IGBT, the voltage of the power supply V1 is 405 V, and the output current ($I_C$) of the semiconductor switching element Q1 is 700 A.

As shown in FIG. 9, a period from the turn-off operation start time point $t_1$ to a time point at which the output voltage ($V_{CE}$) becomes 10% (=40.5 V) of the voltage of the power supply V1 is 470 ns. Then, the rise time from the time point when the output voltage ($V_{CE}$) becomes 10% (=40.5 V) of the voltage of the power supply V1 to the time point when the output voltage ($V_{CE}$) becomes the voltage of the power supply V1 (=405 V) is 90 ns, which is shortened to about ½ of the rise time of the first related circuit in FIG. 5.

Here, even if such shortening is attempted to be performed in the second related circuit, since the propagation delay time of the analog comparator CM is relatively long as described above, the gate drive condition cannot be switched before the output voltage ($V_{CE}$) of the semiconductor switching element Q1 reaches the voltage of the power supply V1. On the other hand, in the present first embodiment, as shown in FIG. 9, the gate drive condition can be switched immediately before the output voltage ($V_{CE}$) of the semiconductor switching element Q1 reaches 405 V being the same as the voltage of the power supply V1.

Since the rise time of the output voltage ($V_{CE}$) is halved, the switching loss of the semiconductor switching element Q1 within the time is also halved. In addition, the surge voltage in FIG. 9 occurring when the output current ($I_C$) falls is 135 V (=540−405), which is lower than 195 V (=615−420) being the surge voltage of the first related circuit in FIG. 5.

Summary of First Embodiment

The semiconductor switching element drive circuit according to the present first embodiment as described above includes not an analog comparator but a logic circuit having a shorter propagation delay time than the analog comparator. According to this configuration, since the switching time point of the gate drive condition can be brought close to an appropriate switching time point, it is possible to achieve reduction in the surge voltage while achieving reduction in the switching loss and shortening of the period td (off). Then, cost reduction and miniaturization can be expected as compared with a semiconductor switching element drive circuit including a discrete high-speed comparator.

Second Embodiment

Figure 10:
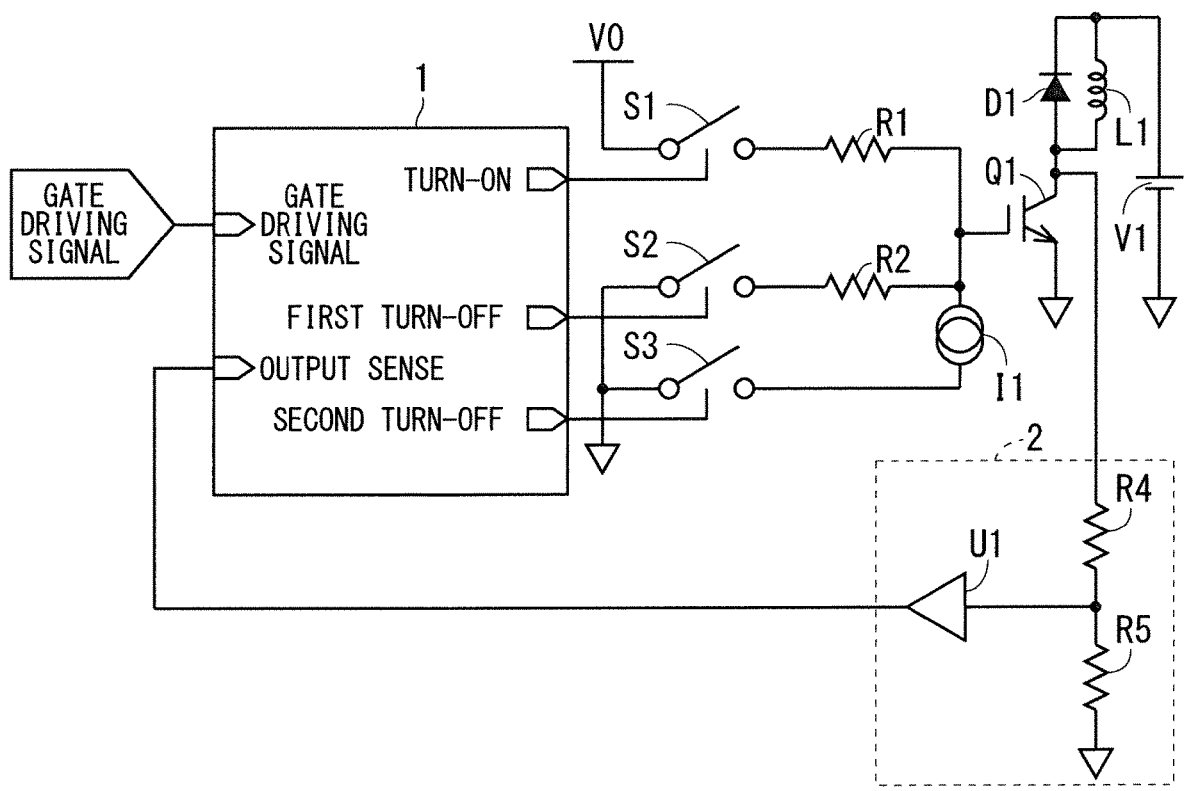
FIG. 10 is a circuit diagram showing a configuration of a semiconductor switching element drive circuit according to a second embodiment.

FIG. 10 is a circuit diagram showing a configuration of a semiconductor switching element drive circuit according to the present second embodiment. Hereinafter, among the components according to the present second embodiment, the components identical or similar to the above-described components will be denoted by the identical or similar reference numerals, and different components will be mainly described.

The drive circuit according to the present second embodiment includes a constant current source I1 instead of the gate resistor R3 with respect to the configuration of the first embodiment (FIG. 6). Here, the gate voltage ($V_{GE}$) during the Miller period during which the gate voltage ($V_{GE}$) of the semiconductor switching element Q1 becomes constant during the turn-off operation is defined as $V_{GE\text{-}Miller}$. If the circuit in FIG. 10 is configured to satisfy the condition of the suction current of the constant current source I1<$V_{GE\text{-}Miller}$/R2, the same operation as the operation in FIG. 7 can be performed. Therefore, since the switching speed of the semiconductor switching element Q1 at and after $t_C$ is reduced, the same effect as that of the first embodiment can be obtained.

It should be noted that in the drive circuit according to the present second embodiment described above, the gate resistor R3 is replaced with the constant current source I1, but the present invention is not limited thereto, and at least one of the gate resistor R2 and the gate resistor R3 may be replaced with a constant current source.

Third Embodiment

Figure 11:
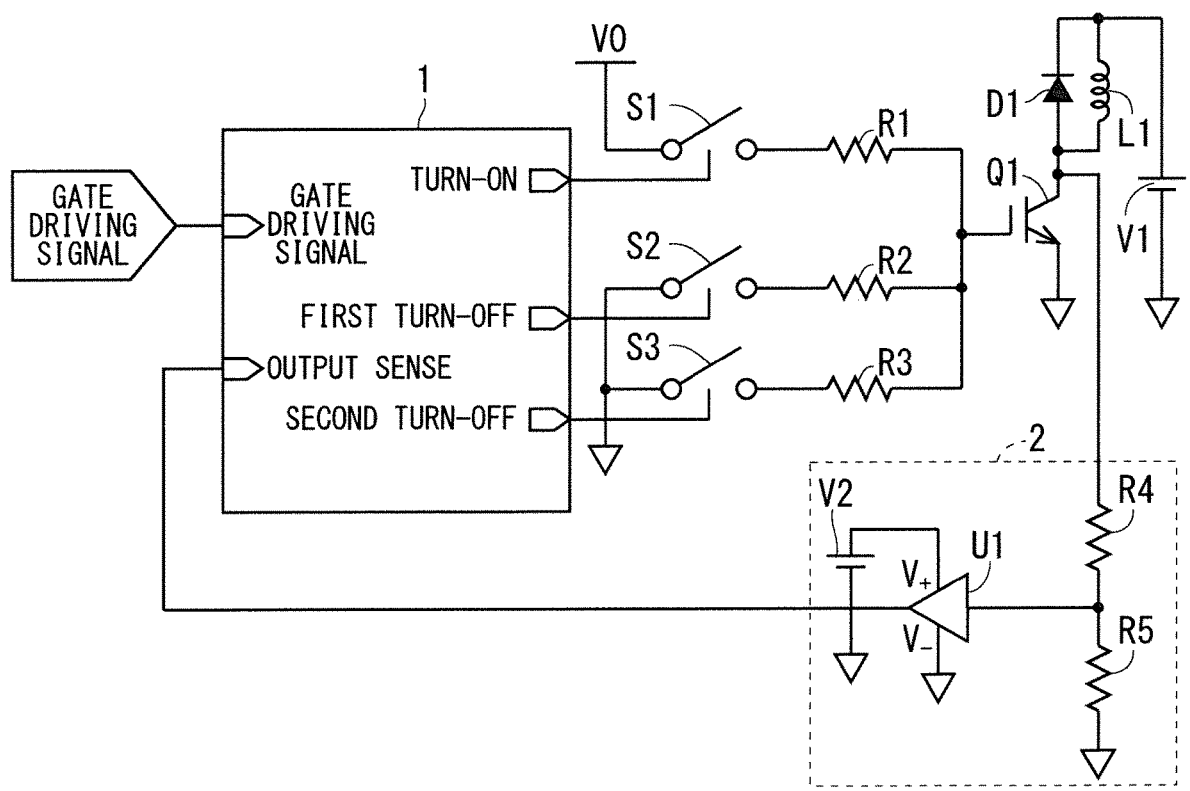
FIG. 11 is a circuit diagram showing a configuration of a semiconductor switching element drive circuit according to a third embodiment.

FIG. 11 is a circuit diagram showing a configuration of the semiconductor switching element drive circuit according to the present third embodiment. Hereinafter, among the components according to the present third embodiment, the components identical or similar to the above-described components will be denoted by the identical or similar reference numerals, and different components will be mainly described.

The configuration of the drive circuit according to the present third embodiment is similar to a configuration in which a high-precision power supply V2 is added to the configuration of the first embodiment (FIG. 6). The high-precision power supply V2 supplies a voltage suppressed in variation and fluctuation to the logic circuit U1 of the output voltage detection unit 2. The voltage supplied to the logic circuit U1 by the high-precision power supply V2 is generated by, for example, at least one of band gap reference having good temperature characteristics and trimming.

According to the present third embodiment, since the variation in the threshold voltage of the logic circuit U1 due to the variation and fluctuation in the power supply voltage of the logic circuit U1 is reduced, it is possible to suppress the variation in the switching time point of the gate drive condition.

Fourth Embodiment

FIG. 12 is a circuit diagram showing a configuration of the semiconductor switching element drive circuit according to the present fourth embodiment. Hereinafter, among the components according to the present fourth embodiment, the components identical or similar to the above-described components will be denoted by the identical or similar reference numerals, and different components will be mainly described.

The configuration of the drive circuit according to the present fourth embodiment is similar to a configuration in which a capacitor C1 and the clamp diode CD are added to the configuration of the first embodiment (FIG. 6). The capacitor C1 is connected to an input unit of the logic circuit U1 of the output voltage detection unit 2 and functions as a low-pass filter. According to the present fourth embodiment, the low-pass filter can reduce the fluctuation in the switching time point of the gate drive condition due to the external noise entering the output voltage ($V_{CE}$) of the semiconductor switching element Q1.

The clamp diode CD is connected to an input unit of the logic circuit U1 of the output voltage detection unit 2, and limits an input signal of the logic circuit U1 to a sum of a power supply voltage (VCC) of the logic circuit U1 and a forward voltage (VF) of the clamp diode CD.

Figure 13:
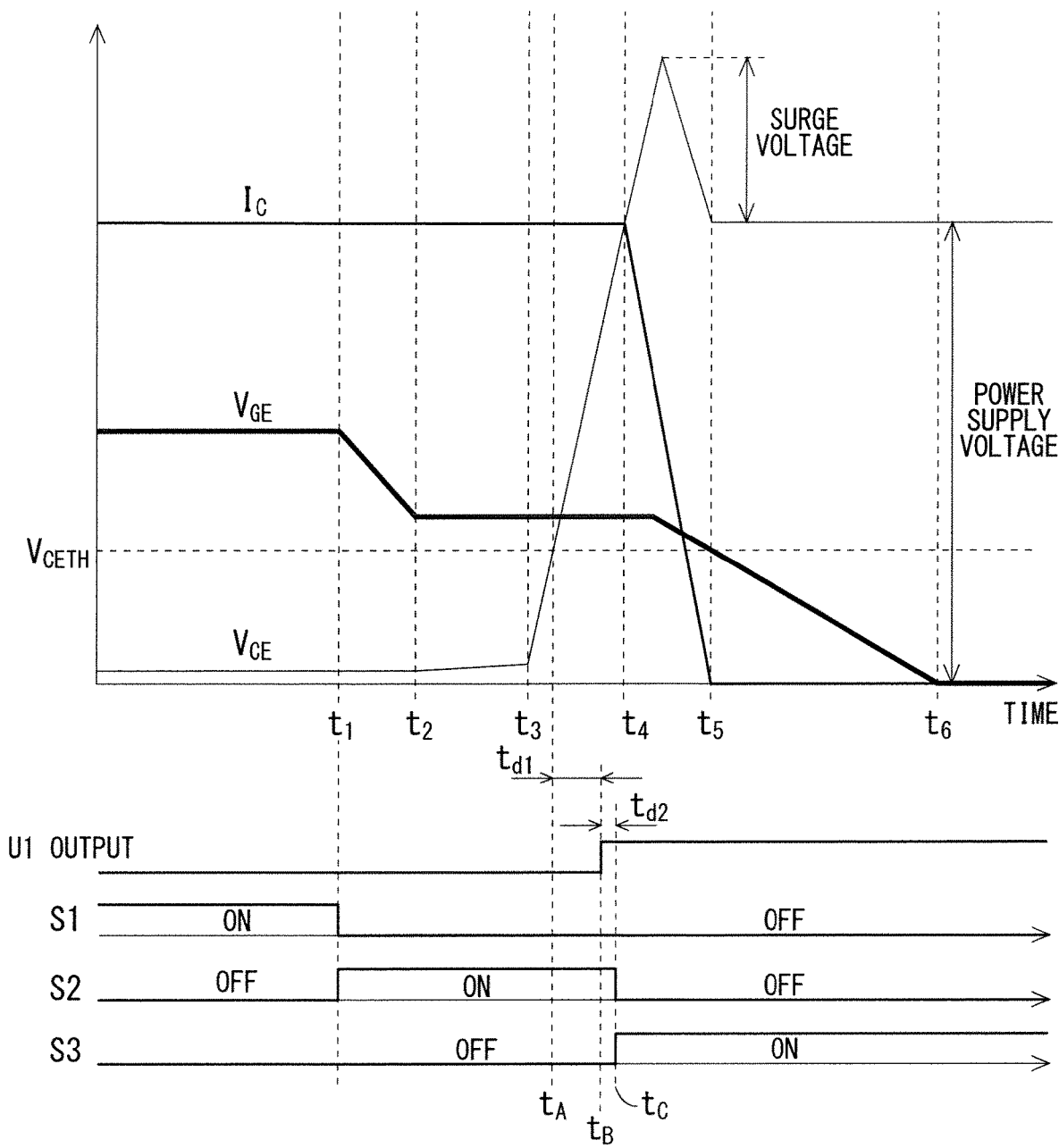
FIG. 13 is a diagram showing a waveform example during a turn-off operation by the semiconductor switching element drive circuit according to the fourth embodiment.

FIG. 13 is a diagram showing a waveform example during a turn-off operation of the semiconductor switching element Q1 by the drive of the drive circuit according to the present fourth embodiment. It should be noted that as shown in FIG. 13, the low-pass filter increases the delay ($t_{d1}$) of the output of the logic circuit U1. On the other hand, by lowering the threshold voltage ($V_{CETH}$) in FIG. 13 for switching the gate drive condition to be lower than the threshold voltage ($V_{CETH}$) in FIG. 7 of the first embodiment, the switching time points $t_B$ and $t_C$ in FIG. 13 are made substantially the same as the switching time points $t_B$ and $t_C$ in FIG. 7 of the first embodiment.

It should be noted that as described above, the threshold voltage ($V_{CETH}$) is determined by the resistance values of the voltage-dividing resistors R4 and R5 and the threshold voltage of the input signal of the logic circuit U1 If the resistance values of the voltage-dividing resistors R4 and R5 are changed in order to lower the threshold voltage ($V_{CETH}$), an input voltage exceeding the power supply voltage (VCC) may be applied to the logic circuit U1 when the semiconductor switching element Q1 is turned off. On the other hand, according to the present fourth embodiment, the clamp diode CD can suppress application of such an input voltage to the logic circuit U1.

Fifth Embodiment

FIG. 14 is a circuit diagram showing a configuration of the semiconductor switching element drive circuit according to the present fifth embodiment. Hereinafter, among the components according to the present fifth embodiment, the components identical or similar to the above-described components will be denoted by the identical or similar reference numerals, and different components will be mainly described.

The configuration of the drive circuit according to the present fifth embodiment is similar to a configuration in which a speed-up capacitor C2 is added to the configuration of the first embodiment (FIG. 6). The speed-up capacitor C2 is connected in parallel with the gate resistor R2.

Here, the speed-up capacitor C2 can shorten and adjust the period $t_1$ to $t_3$ from the turn-off operation start time point to the output voltage sudden rise start time point in FIG. 7. The gate resistor R2 can shorten and adjust the output voltage sudden rise period $t_3$ to $t_4$ in FIG. 7. The gate resistor R3 can shorten and adjust the output current fall period at and after $t_4$ in FIG. 7. As described above, according to the present fifth embodiment, these periods can be individually adjusted.

Sixth Embodiment

Figure 15:
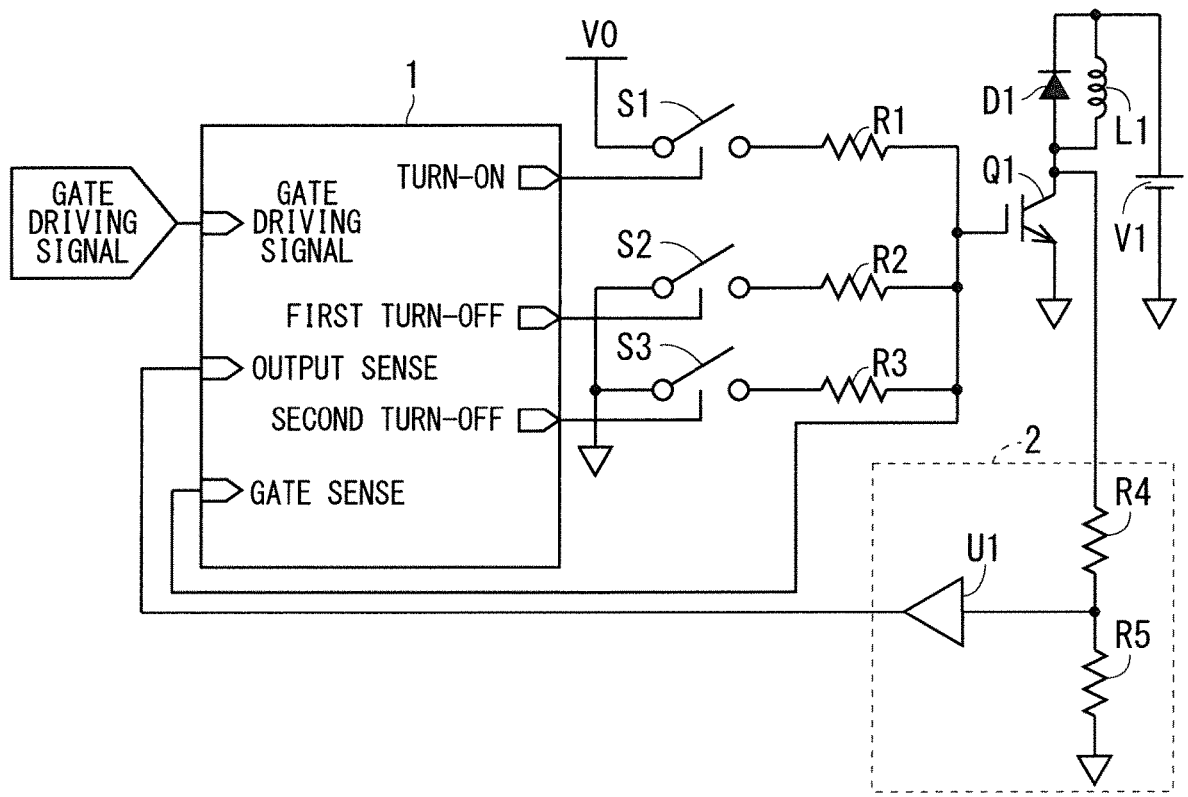
FIG. 15 is a circuit diagram showing a configuration of a semiconductor switching element drive circuit according to a sixth embodiment.

FIG. 15 is a circuit diagram showing a configuration of the semiconductor switching element drive circuit according to the present sixth embodiment. Hereinafter, among the components according to the present sixth embodiment, the components identical or similar to the above-described components will be denoted by the identical or similar reference numerals, and different components will be mainly described.

The configuration of the drive circuit according to the present sixth embodiment is similar to a configuration in which a gate sense function of monitoring the gate voltage of the semiconductor switching element Q1 is added to the control unit 1 in the configuration of the first embodiment (FIG. 6). It should be noted that although not shown in FIG. 15, a gate sink function of rapidly decreasing the gate voltage is also added to the control unit 1 according to the present sixth embodiment.

After the gate drive condition of the semiconductor switching element Q1 is switched from the first gate drive condition to the second gate drive condition, the control unit 1 determines whether the gate voltage ($V_{GE}$) of the semiconductor switching element Q1 is equal to or lower than the threshold voltage ($V_{GESINK}$). Then, when determining that the gate voltage ($V_{GE}$) is equal to or lower than the threshold voltage ($V_{GESINK}$), the control unit 1 executes the gate sink function on the semiconductor switching element Q1.

Figure 16:
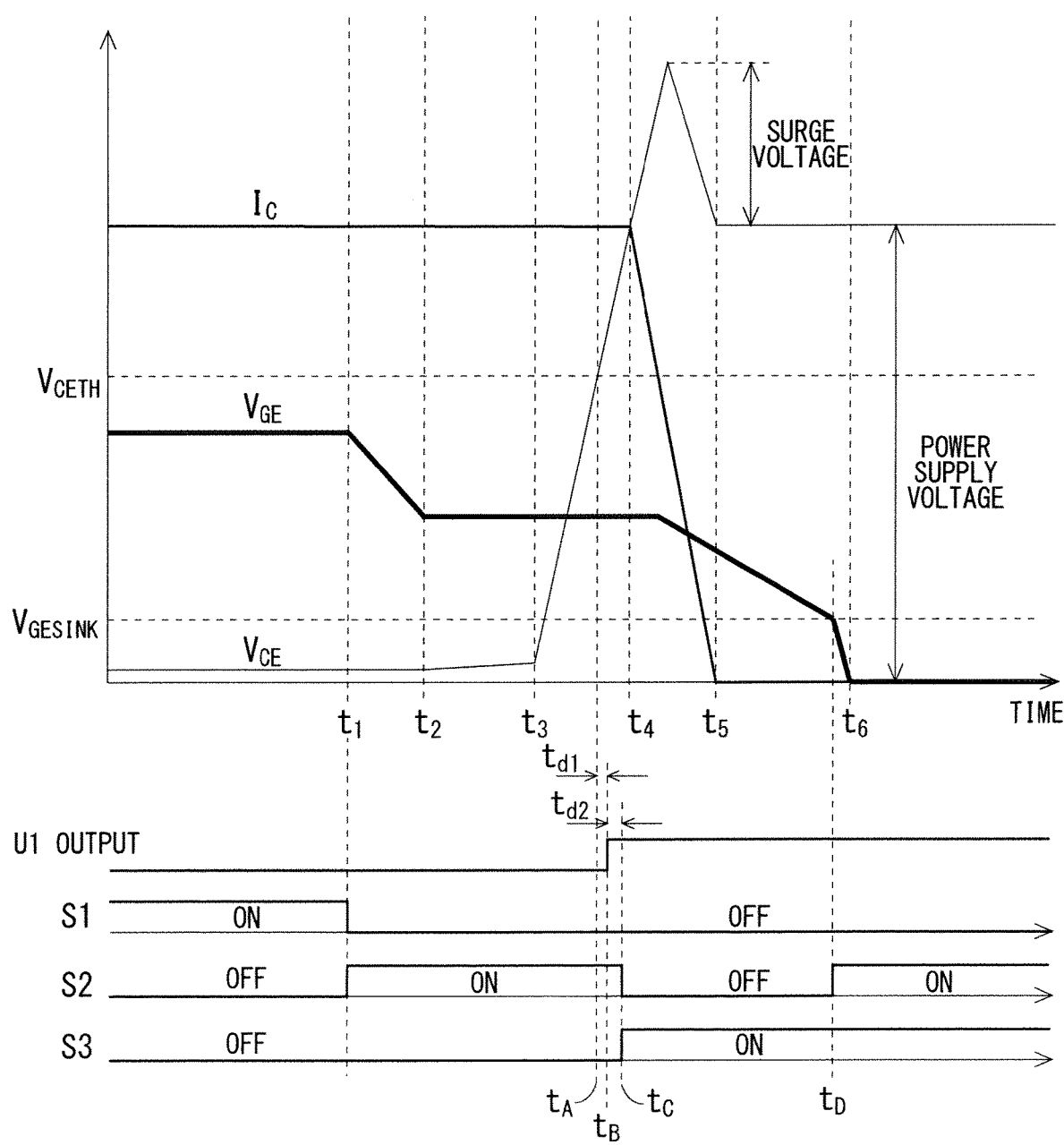
FIG. 16 is a diagram showing a waveform example during a turn-off operation by the semiconductor switching element drive circuit according to the sixth embodiment.

FIG. 16 is a diagram showing a waveform example during a turn-off operation of the semiconductor switching element Q1 by the drive of the drive circuit according to the present sixth embodiment, and is a diagram corresponding to FIG. 7. FIG. 17 is a diagram showing another waveform example during a turn-off operation of the semiconductor switching element Q1 by the drive of the drive circuit according to the present sixth embodiment, and is a diagram corresponding to FIG. 8.

The $t_D$ is a time point at which the gate voltage ($V_{GE}$) of the semiconductor switching element Q1 reaches the threshold voltage ($V_{GESINK}$) of the gate sink function. In both the operations in FIGS. 16 and 17, at and after $t_D$ when the gate voltage ($V_{GE}$) of the semiconductor switching element Q1 becomes equal to or lower than a predetermined threshold voltage ($V_{GESINK}$), the gate voltage ($V_{GE}$) of the semiconductor switching element Q1 rapidly decreases. As described above, the control unit 1 has a gate sink function of rapidly decreasing the gate voltage ($V_{GE}$) of the semiconductor switching element Q1. In the examples in FIGS. 16 and 17, the control unit 1 turns on the switch S2 and the switch S3 and electrically connects the ground potential to the gate of the semiconductor switching element Q1 via the gate resistors R2 and R3, whereby the gate sink function is executed.

FIG. 18 is a diagram showing an actual measured waveform during a turn-off operation of the semiconductor switching element Q1 by the drive of the drive circuit according to the present sixth embodiment. It should be noted that the semiconductor switching element Q1 is an IGBT, the voltage of the power supply V1 is 400 V, and the output current ($I_C$) of the semiconductor switching element Q1 is 700 A.

As shown in FIG. 18, the voltage division ratio of the voltage-dividing resistors R4 and R5 is adjusted so that the output signal of the logic circuit U1 is inverted when the output voltage ($V_{CE}$) exceeds 170 V, and the output voltage ($V_{CE}$) of the semiconductor switching element Q1 is 260 V at time point $t_C$. In the actual measured waveform when the logic circuit U1 and the control unit 1 are configured with high-speed CMOS logic, the delay time from $t_A$ to $t_C$ is about 15 ns.

In FIG. 18, since the gate drive condition is switched at $t_C$, a peak occurs in the waveform of the gate voltage ($V_{GE}$) of the semiconductor switching element Q1 immediately after $t_C$. This is because the gate discharge current rapidly decreases due to the switching of the gate drive condition, and an induction voltage is generated in the parasitic inductance between the semiconductor switching element drive circuit and the semiconductor switching element Q1.

In addition, in FIG. 18, the gate sink function of the drive circuit according to the present sixth embodiment is executed at $t_D$, and the gate voltage ($V_{GE}$) of the semiconductor switching element Q1 rapidly decreases.

In general, in an H-bridge, a three-phase inverter, or the like including semiconductor switching elements connected in series, as described above, after a dead time being a certain period ($t_{dead}$) has elapsed since the start of turn-off operation of one of the semiconductor switching elements, the turn-on operation of the other is started. According to the present sixth embodiment, since the gate voltage ($V_{GE}$) can be quickly reduced at the final stage of the turn-off operation, the dead time can be shortened as compared with that of the first embodiment.

Seventh Embodiment

FIG. 19 is a circuit diagram showing a configuration of the semiconductor switching element drive circuit according to the present seventh embodiment. Hereinafter, among the components according to the present seventh embodiment, the components identical or similar to the above-described components will be denoted by the identical or similar reference numerals, and different components will be mainly described.

The configuration of the drive circuit according to the present seventh embodiment is similar to a configuration in which a timer 1a is added to the control unit 1 in the configuration of the first embodiment (FIG. 6). It should be noted that the timer 1a may be provided outside the control unit 1.

Figure 20:
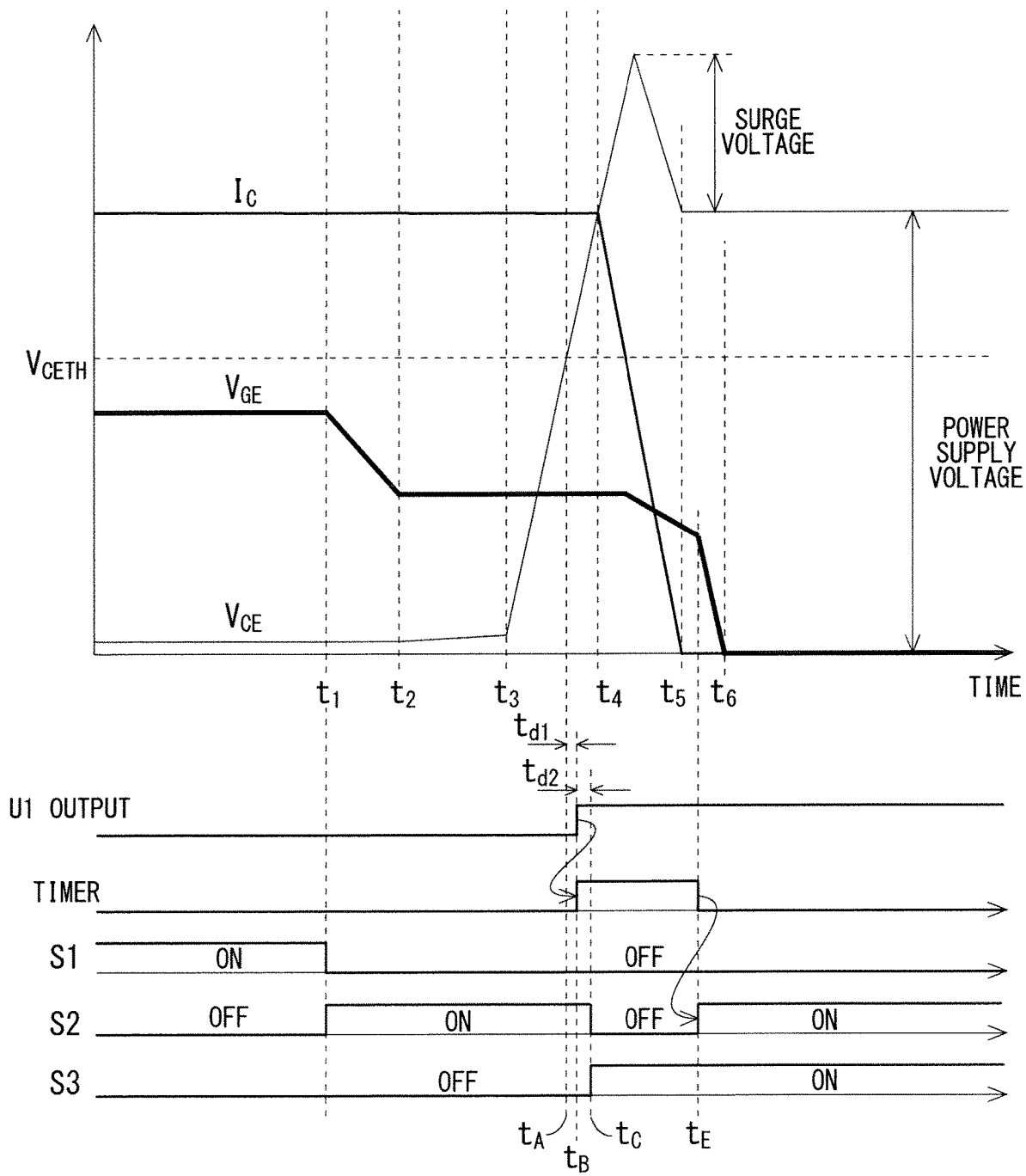
FIG. 20 is a diagram showing a waveform example during a turn-off operation by the semiconductor switching element drive circuit according to the seventh embodiment.
Figure 21:
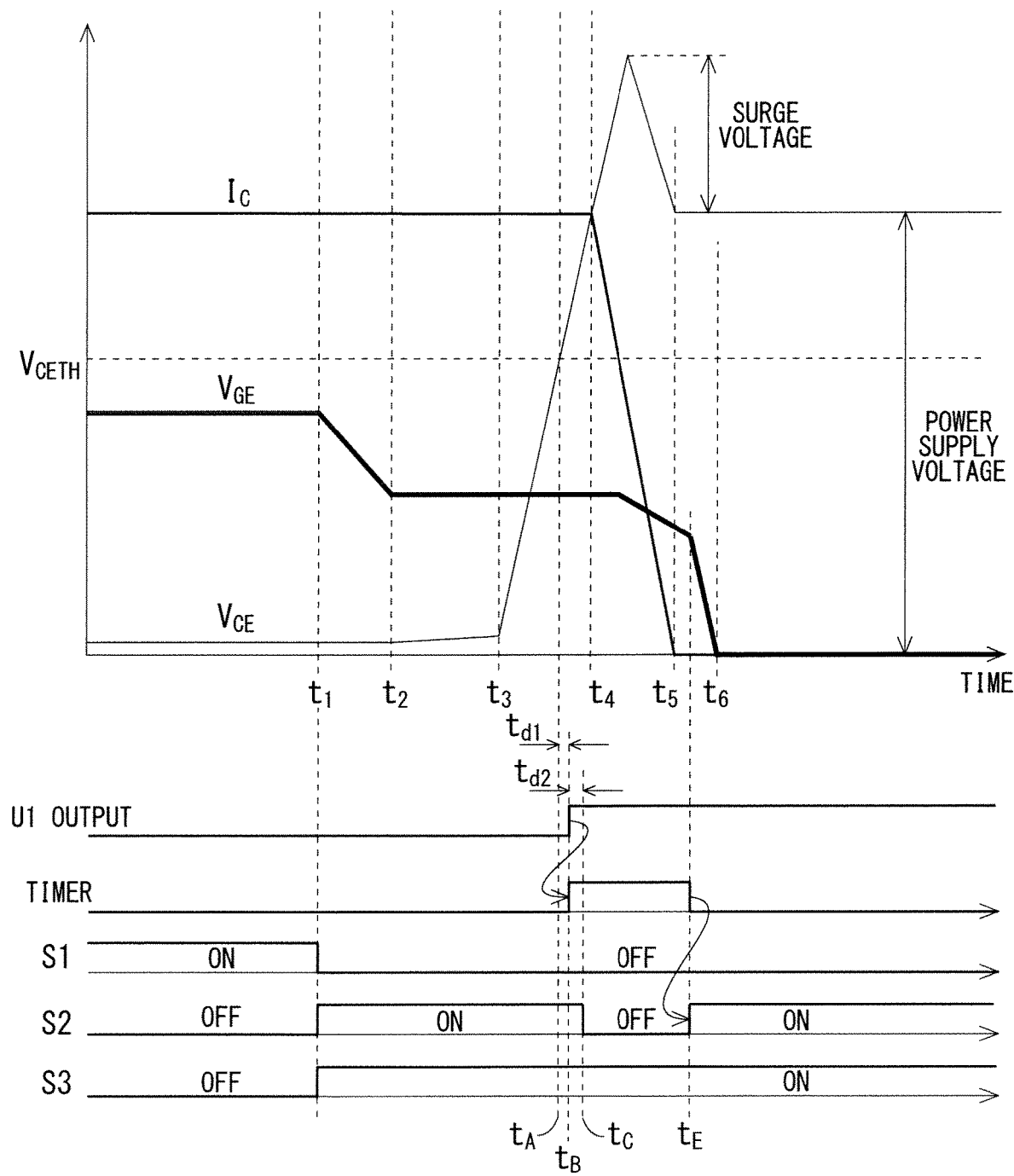
FIG. 21 is a diagram showing another waveform example during a turn-off operation by the semiconductor switching element drive circuit according to the seventh embodiment.

FIG. 20 is a diagram showing a waveform example during a turn-off operation of the semiconductor switching element Q1 by the drive of the drive circuit according to the present seventh embodiment, and is a diagram corresponding to FIG. 7. FIG. 21 is a diagram showing another waveform example during a turn-off operation of the semiconductor switching element Q1 by the drive of the drive circuit according to the present seventh embodiment, and is a diagram corresponding to FIG. 8. The $t_E$ is a time point at which the counting of the timer 1a ends.

The timer 1a starts counting from switching time points $t_B$ and $t_C$ when the gate drive condition of the semiconductor switching element Q1 is switched from the first gate drive condition to the second gate drive condition. Then, the timer 1a ends the counting at a time point $t_5$ when the output current ($I_C$) of the semiconductor switching element Q1 becomes zero or at a timepoint thereafter. In order to achieve this, in the present seventh embodiment, the timer 1a counts a predetermined period ($t_B$, $t_C$ to $t_E$) equal to or longer than a period from the switching time points $t_B$ and $t_C$ to a time point $t_5$ at which the output current ($I_C$) becomes zero. The predetermined period ($t_B$, $t_C$ to $t_E$) is set by, for example, actual machine measurement or simulation.

As in the sixth embodiment, the control unit 1 executes the gate sink function of rapidly decreasing the gate voltage ($V_{GE}$) of the semiconductor switching element Q1 at time point $t_E$ when the timer 1a finishes counting.

According to the present seventh embodiment as described above, as in the sixth embodiment, since the gate voltage ($V_{GE}$) can be quickly reduced at the final stage of the turn-off operation, the dead time can be shortened as compared with that of the first embodiment.

Eighth Embodiment

Figure 22:
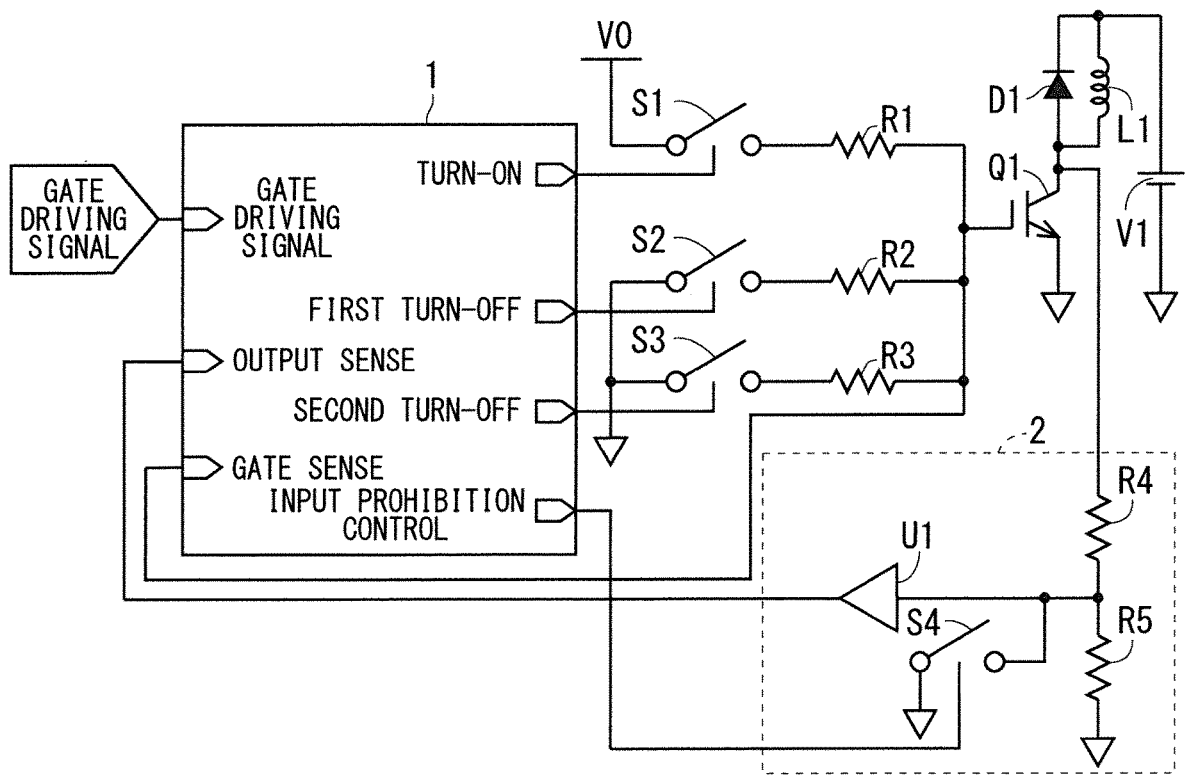
FIG. 22 is a circuit diagram showing a configuration of a semiconductor switching element drive circuit according to an eighth embodiment.

FIG. 22 is a circuit diagram showing a configuration of the semiconductor switching element drive circuit according to the present eighth embodiment. Hereinafter, among the components according to the present eighth embodiment, the components identical or similar to the above-described components will be denoted by the identical or similar reference numerals, and different components will be mainly described.

The configuration of the drive circuit according to the present eighth embodiment is similar to a configuration in which a switch S4 (cutoff circuit) is added to the output voltage detection unit 2 in the configuration of the sixth embodiment (FIG. 15). It should be noted that the switch S4 may be provided outside the output voltage detection unit 2.

The switch S4 cuts off the input of the divided voltage to the logic circuit U1 except for a period from when the turn-off operation of the semiconductor switching element Q1 is started until the gate voltage ($V_{GE}$) of the semiconductor switching element Q1 becomes equal to or less than a predetermined threshold value. The cutoff of the switch S4 is controlled by the control unit 1.

Figure 23:
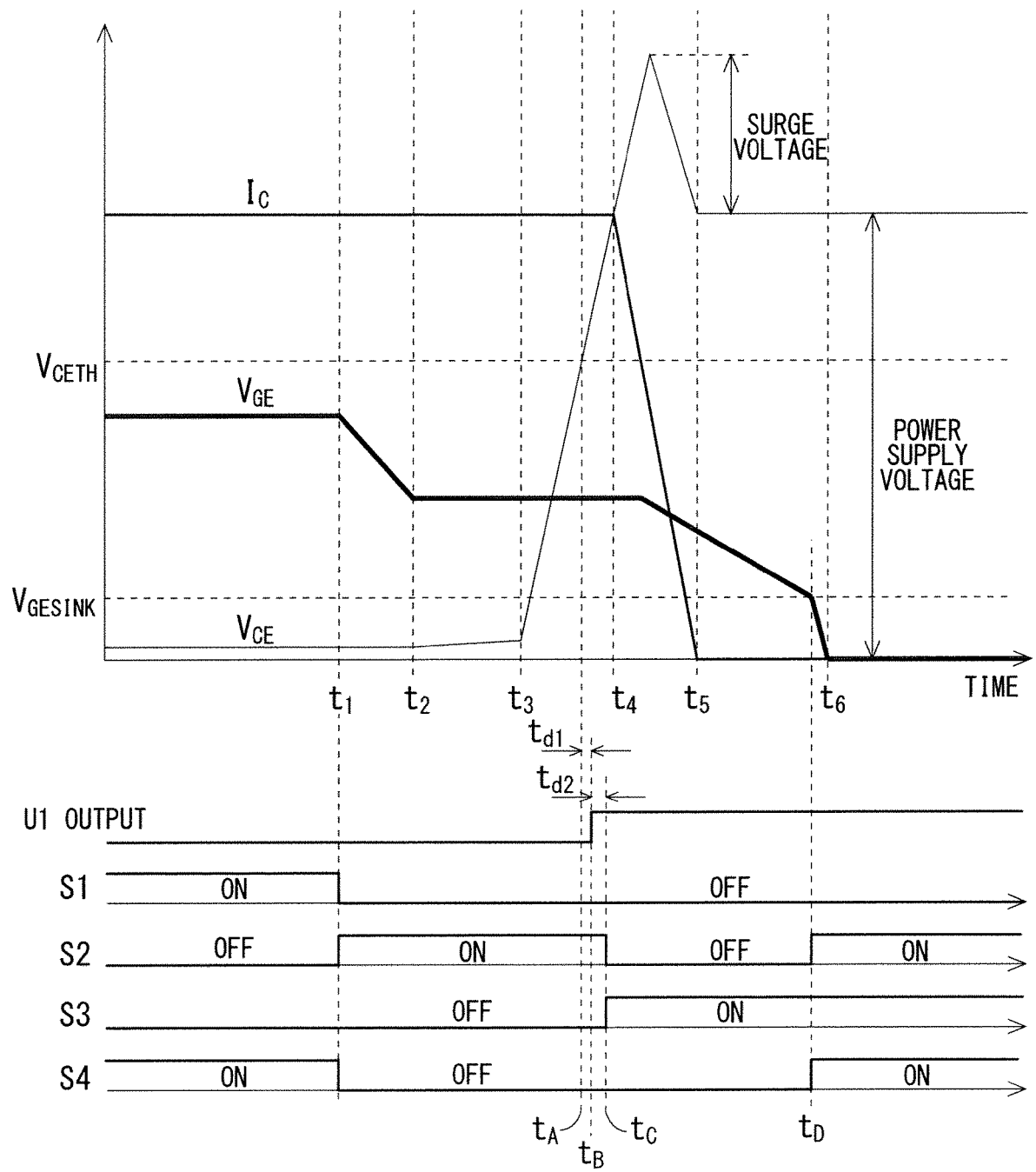
FIG. 23 is a diagram showing a waveform example during a turn-off operation by the semiconductor switching element drive circuit according to the eighth embodiment.
Figure 24:
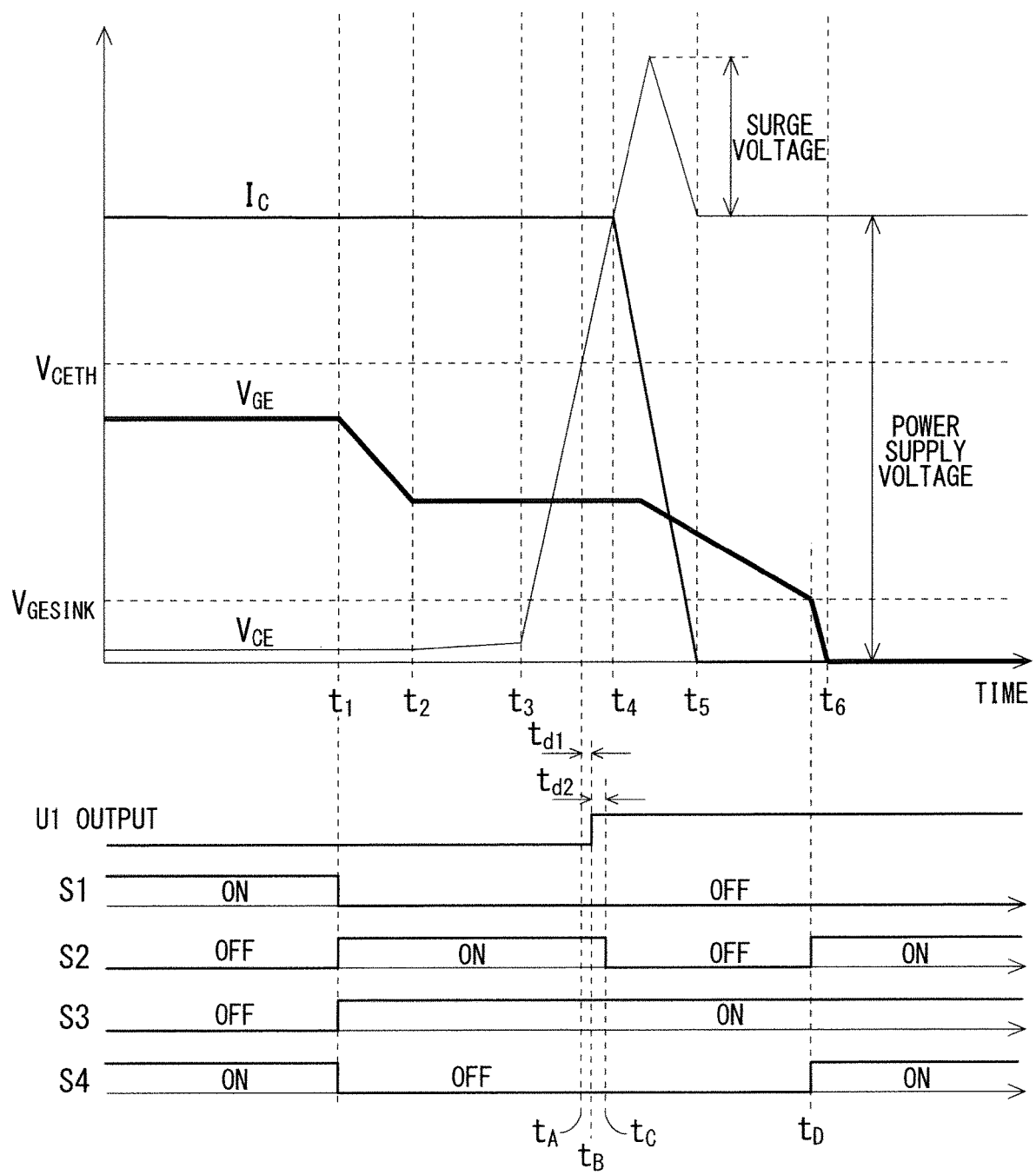
FIG. 24 is a diagram showing another waveform example during a turn-off operation by the semiconductor switching element drive circuit according to the eighth embodiment.

FIG. 23 is a diagram showing a waveform example during a turn-off operation of the semiconductor switching element Q1 by the drive of the drive circuit according to the present eighth embodiment, and is a diagram corresponding to FIG. 7. FIG. 24 is a diagram showing another waveform example during a turn-off operation of the semiconductor switching element Q1 by the drive of the drive circuit according to the present eighth embodiment, and is a diagram corresponding to FIG. 8.

The switch S4 inputs a signal to the logic circuit U1 only during a period from the turn-off operation start time point $t_1$ of the semiconductor switching element Q1 until a time point $t_D$ at which the gate voltage ($V_{GE}$) of the semiconductor switching element Q1 decreases to a predetermined threshold voltage ($V_{GESINK}$) or less.

According to the present eighth embodiment as described above, since it is possible to suppress the input of the prohibition voltage between the threshold voltages of High and Low to the logic circuit U1, which may occur when the voltage of the power supply V1 is low, stable operation can be performed even when the voltage width of the power supply V1 is large.

Ninth Embodiment

FIG. 25 is a circuit diagram showing a configuration of the semiconductor switching element drive circuit according to the present ninth embodiment. Hereinafter, among the components according to the present ninth embodiment, the components identical or similar to the above-described components will be denoted by the identical or similar reference numerals, and different components will be mainly described.

The configuration of the drive circuit according to the present ninth embodiment is similar to a configuration in which a switch S4 (cutoff circuit) is added to the output voltage detection unit 2 in the configuration of the first embodiment (FIG. 6). It should be noted that the switch S4 may be provided outside the output voltage detection unit 2.

The switch S4 cuts off the input of the divided voltage to the logic circuit U1 except for a period from when the turn-off operation of the semiconductor switching element Q1 is started until the gate drive condition of the semiconductor switching element Q1 is switched from the first gate drive condition to the second gate drive condition. The cutoff of the switch S4 is controlled by the control unit 1.

Figure 26:
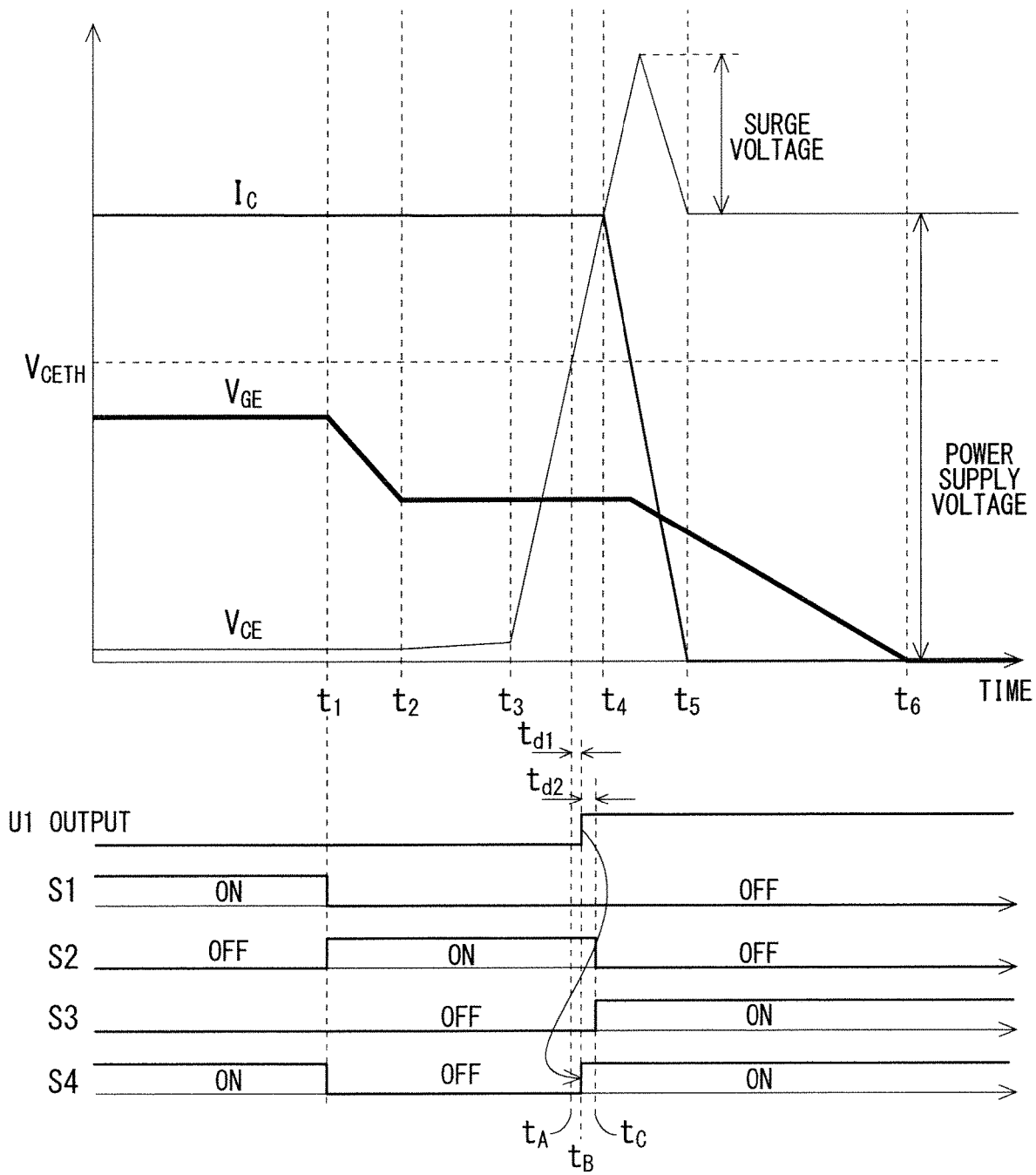
FIG. 26 is a diagram showing a waveform example during a turn-off operation by the semiconductor switching element drive circuit according to the ninth embodiment.
Figure 27:
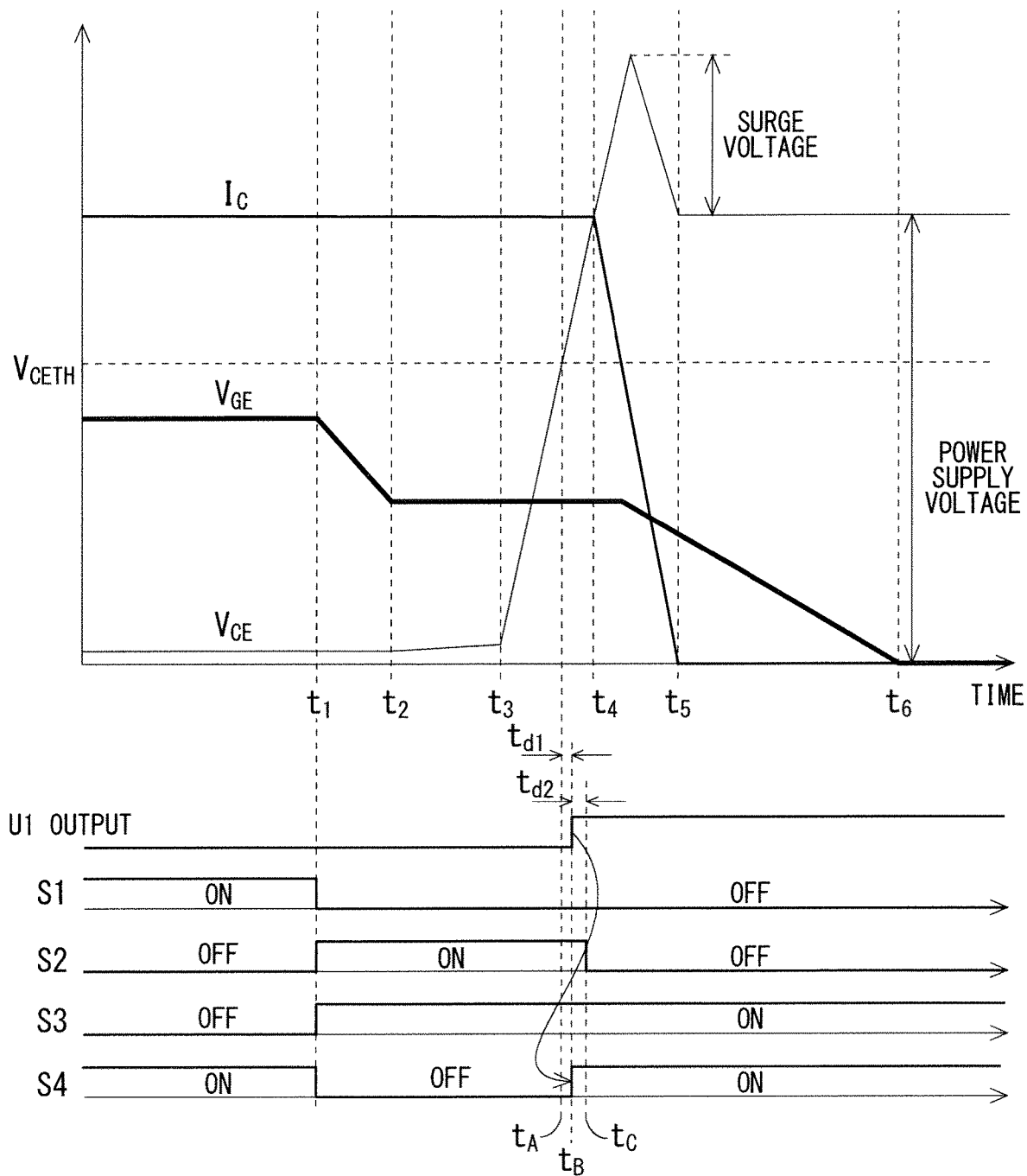
FIG. 27 is a diagram showing another waveform example during a turn-off operation by the semiconductor switching element drive circuit according to the ninth embodiment.

FIG. 26 is a diagram showing a waveform example during a turn-off operation of the semiconductor switching element Q1 by the drive of the drive circuit according to the present ninth embodiment, and is a diagram corresponding to FIG. 7. FIG. 27 is a diagram showing another waveform example during a turn-off operation of the semiconductor switching element Q1 by the drive of the drive circuit according to the present ninth embodiment, and is a diagram corresponding to FIG. 8.

In the examples in FIGS. 26 and 27, the switch S4 inputs a signal to the logic circuit U1 only during a period from the turn-off operation start time point $t_1$ of the semiconductor switching element Q1 until a time point $t_B$ at which output signal of the logic circuit U1 is inverted through a time point at which the output voltage ($V_{CE}$) of the semiconductor switching element Q1 exceeds the threshold voltage ($V_{CETH}$). It should be note that the switch S4 may input a signal to the logic circuit U1 only during a period from the turn-off operation start time point $t_1$ of the semiconductor switching element Q1 to a time point $t_C$ at which the switch S2 and the switch S3 are switched.

FIG. 28 is a diagram showing an actual measured waveform during a turn-off operation of the semiconductor switching element Q1 in the drive circuit according to the present ninth embodiment. It should be noted that the semiconductor switching element Q1 is an IGBT, the voltage of the power supply V1 is 30 V, and the output current ($I_C$) of the semiconductor switching element Q1 is 300 A. The voltage division ratio of the voltage-dividing resistors R4 and R5 is adjusted so that the output of the logic circuit U1 is inverted when the output voltage ($V_{CE}$) exceeds 210 V.

FIG. 28 shows a measurement result of the input signal (Signal Fed to U1) of the logic circuit U1. In the example in FIG. 28, the switch S4 cuts off the input to the logic circuit U1 except for a period larger than the above-described period. Specifically, the switch S4 inputs a signal to the logic circuit U1 only during a period from $t_A$ to $t_C$.

According to the present ninth embodiment as described above, since it is possible to suppress the input of the prohibition voltage between the threshold voltages of High and Low to the logic circuit U1, which may occur when the voltage of the power supply V1 is low, stable operation can be performed even when the voltage width of the power supply V1 is large. In addition, unlike the eighth embodiment, a gate sense function (circuit) for monitoring the gate voltage of the semiconductor switching element Q1 of the control unit 1 is not required.

Tenth Embodiment

FIG. 29 is a circuit diagram showing a configuration of the semiconductor switching element drive circuit according to the present tenth embodiment. Hereinafter, among the components according to the present tenth embodiment, the components identical or similar to the above-described components will be denoted by the identical or similar reference numerals, and different components will be mainly described.

The drive circuit according to the present embodiment 10 is similar to a configuration in which a high-precision power supply V2 as in the third embodiment, a speed-up capacitor C2 as in the fifth embodiment, and a switch S4 as in the ninth embodiment are added to the configuration of the first embodiment (FIG. 6), and a gate sense function (circuit) and a gate sink function (circuit) are added to the control unit 1 as in the sixth embodiment.

Figure 30:
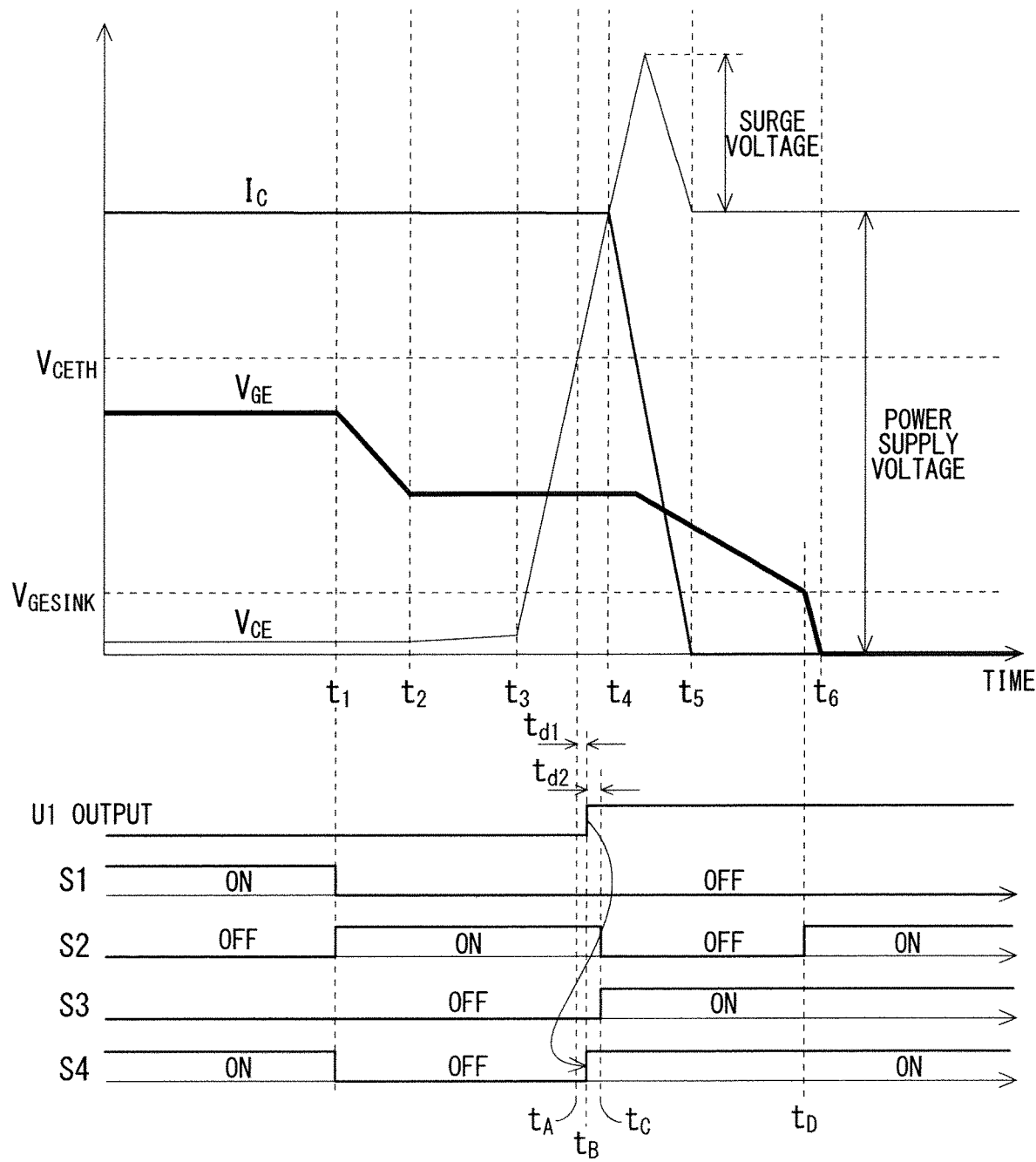
FIG. 30 is a diagram showing a waveform example during a turn-off operation by the semiconductor switching element drive circuit according to the tenth embodiment.
Figure 31:
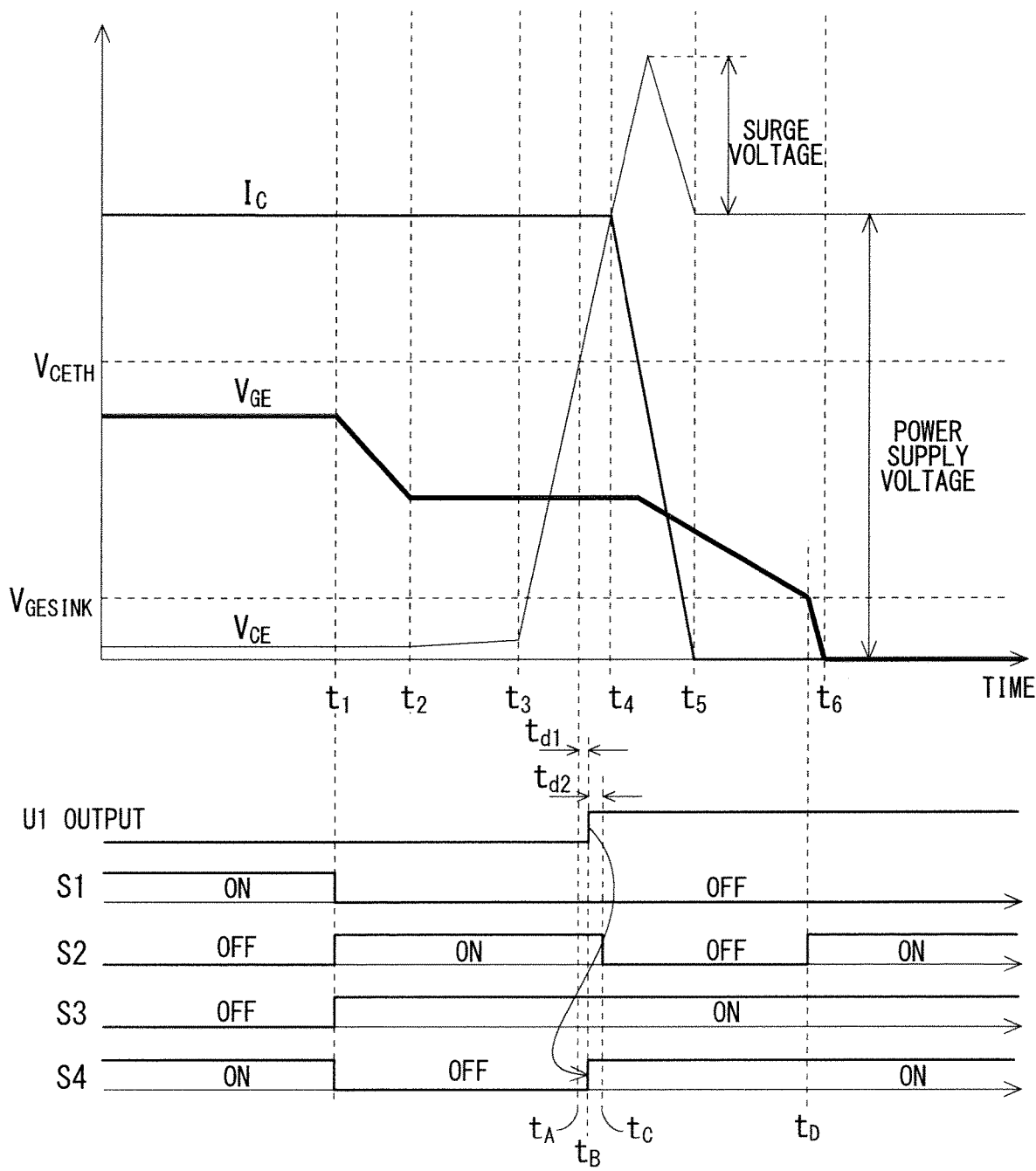
FIG. 31 is a diagram showing another waveform example during a turn-off operation by the semiconductor switching element drive circuit according to the tenth embodiment.

FIG. 30 is a diagram showing a waveform example during a turn-off operation of the semiconductor switching element Q1 by the drive of the drive circuit according to the present tenth embodiment, and is a diagram corresponding to FIG. 7. FIG. 31 is a diagram showing another waveform example during a turn-off operation of the semiconductor switching element Q1 by the drive of the drive circuit according to the present tenth embodiment, and is a diagram corresponding to FIG. 8.

By the gate sense function and the gate sink function of the control unit 1, the gate voltage ($V_{GE}$) of the semiconductor switching element Q1 rapidly decreases, at and after $t_D$ at which the gate voltage ($V_{GE}$) of the semiconductor switching element Q1 becomes equal to or lower than a predetermined threshold voltage ($V_{GESINK}$). In addition, the switch S4 inputs a signal to the logic circuit U1 only during a period from the turn-off operation start time point $t_1$ of the semiconductor switching element Q1 until a time point $t_B$ at which the output signal of the logic circuit U1 is inverted through a time point at which the output voltage ($V_{CE}$) of the semiconductor switching element Q1 exceeds the threshold voltage ($V_{CETH}$).

According to the configuration of the present tenth embodiment as described above, effects similar to the effects described in the first, third, fifth, sixth, and ninth embodiments can be obtained.

Eleventh Embodiment

Figure 32:
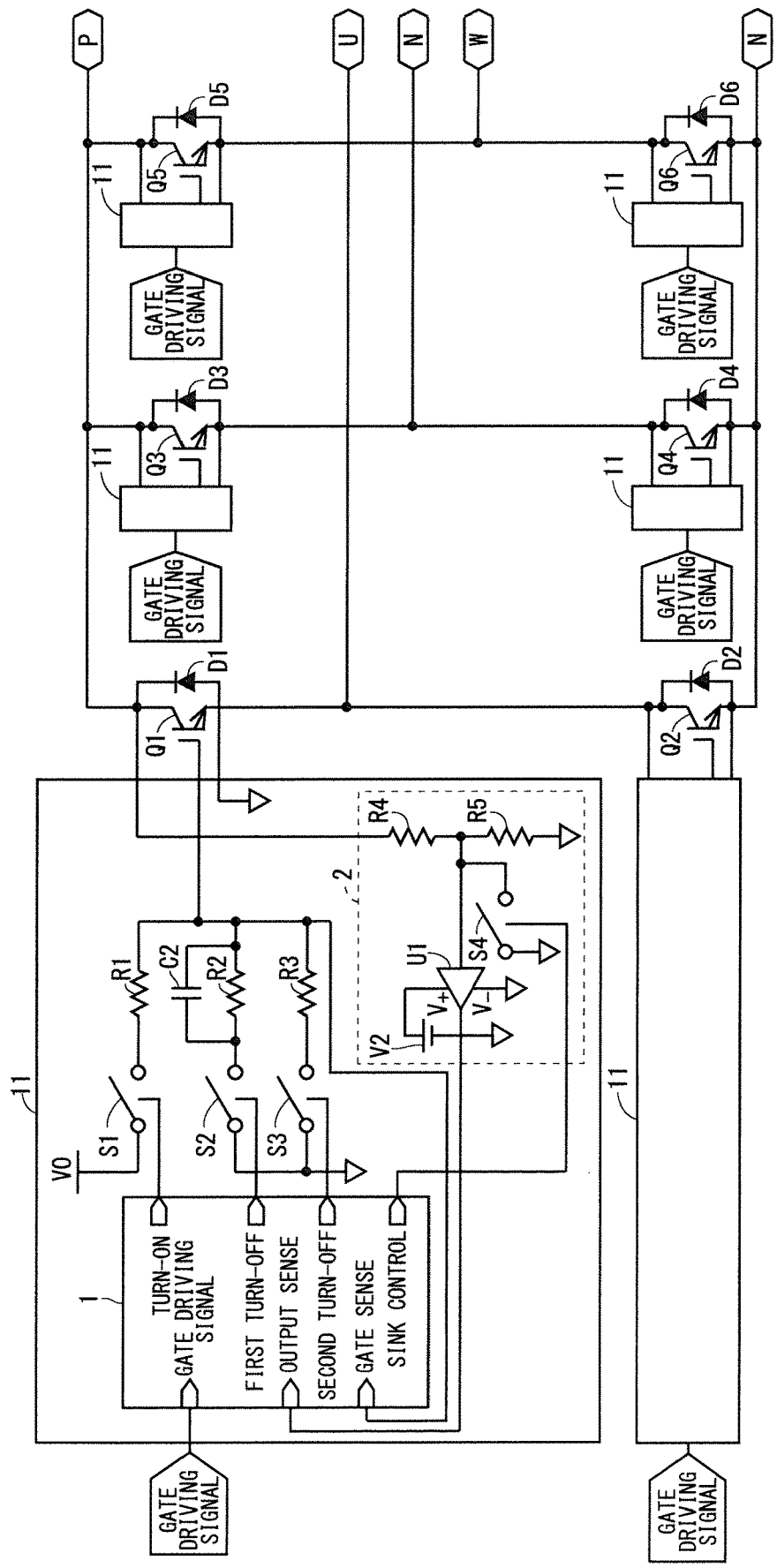
FIG. 32 is a circuit diagram showing a configuration of a semiconductor device according to an eleventh embodiment.

FIG. 32 is a circuit diagram showing a configuration of a semiconductor device according to the present eleventh embodiment. Hereinafter, among the components according to the present eleventh embodiment, the components identical or similar to the above-described components will be denoted by the identical or similar reference numerals, and different components will be mainly described.

A semiconductor device according to the present eleventh embodiment includes a plurality of semiconductor switching elements Q1 to Q6, a plurality of diodes D1 to D6, and a plurality of gate drive circuits I1. Each of the plurality of semiconductor switching elements Q1 to Q6 in FIG. 32 is the semiconductor switching element Q1 of the first to tenth embodiments. Each of the plurality of diodes D1 to D6 in FIG. 32 is the diode D1 of the first to tenth embodiments. Each of the plurality of gate drive circuits I1 in FIG. 32 is a semiconductor switching element drive circuit of the first to tenth embodiments. It should be noted that FIG. 32 shows an example in which the gate drive circuit I1 is a semiconductor switching element drive circuit of the tenth embodiment, but the present disclosure is not limited thereto.

In the example in FIG. 32, the plurality of semiconductor switching elements Q1 to Q6 constitute a three-phase inverter used for driving a three-phase motor or the like, but the present disclosure is not limited thereto, and may constitute an H-bridge, for example.

The plurality of gate drive circuits I1 drive the plurality of semiconductor switching elements Q1 to Q6, respectively, similarly to the semiconductor switching element drive circuit of the first to tenth embodiments.

According to the present eleventh embodiment as described above, since it is possible to reduce the delay time (period td (off)) during the turn-off operation of the semiconductor switching elements Q1 to Q6, and eventually, the dead time during the operation of the inverter, the effective output voltage of the inverter can be increased.

In addition, since it is possible to improve the trade-off characteristic between the surge voltage and the switching loss occurring during the turn-off operation of the semiconductor switching elements Q1 to Q6, it is possible to achieve reduction in loss and a high withstand voltage of the inverter. In addition, cost reduction and miniaturization can be expected as compared with a semiconductor device including a gate drive circuit including a discrete high-speed comparator.

It should be noted that each of the embodiments and each of the modifications can be freely combined, and each of the embodiments and each of the modifications can be appropriately modified or omitted.

The above description is exemplary in all aspects, and the present disclosure is not limited thereto. It is understood that myriad modifications not exemplified can be assumed without departing from the scope of the present disclosure.

Explanation of Reference Signs

1: control unit
1a: timer
11: gate drive circuit
C1: capacitor
C2: speed-up capacitor
CD: clamp diode
S1 to S4: switch
R1 to R3: gate resistor
R4, R5: voltage-dividing resistor
Q1 to Q6: semiconductor switching element
U1: logic circuit
V2: high-precision power supply

The invention claimed is:

1. A semiconductor switching element drive circuit configured to drive a semiconductor switching element, the semiconductor switching element drive circuit comprising:

a voltage-dividing resistor configured to generate a divided voltage of an output voltage of the semiconductor switching element;

a logic circuit configured to invert a level of an output signal based on the divided voltage;

a switching circuit configured to switch a gate drive condition of the semiconductor switching element during a turn-off operation from a first gate drive condition in which a switching speed of the semiconductor switching element is a first switching speed to a second gate drive condition in which the switching speed is a second switching speed lower than the first switching speed based on the output signal from the logic circuit; and a cutoff circuit configured to cut off an input of the divided voltage to the logic circuit except for a period from when a turn-off operation of the semiconductor switching element is started until a gate drive condition of the semiconductor switching element is switched from the first gate drive condition to the second gate drive condition, wherein a comparator is not connected between the divided voltage and an input of the switching circuit.

2. The semiconductor switching element drive circuit according to claim 1, further comprising a power supply configured to supply a voltage generated by at least any one of band gap reference and trimming to the logic circuit.

3. The semiconductor switching element drive circuit according to claim 1, further comprising a low-pass filter and a clamp diode connected between the logic circuit and the voltage-dividing resistor.

4. The semiconductor switching element drive circuit according to claim 1, further comprising:

a first resistor electrically connected to a gate of the semiconductor switching element when a gate drive condition of the semiconductor switching element is the first gate drive condition;

a second resistor electrically connected to a gate of the semiconductor switching element when a gate drive condition of the semiconductor switching element is the second gate drive condition; and a speed-up capacitor connected in parallel with the first resistor.

5. The semiconductor switching element drive circuit according to claim 1, wherein the switching circuit executes a gate sink function on the semiconductor switching element when a gate voltage of the semiconductor switching element is equal to or less than a predetermined threshold value after a gate drive condition of the semiconductor switching element is switched from the first gate drive condition to the second gate drive condition.

6. The semiconductor switching element drive circuit according to claim 1, further comprising a timer configured to count a predetermined period equal to or longer than a period from a time point at which a gate drive condition of the semiconductor switching element is switched from the first gate drive condition to the second gate drive condition to a time point at which an output current of the semiconductor switching element becomes zero, wherein the switching circuit executes a gate sink function on the semiconductor switching element when the timer ends counting.

7. The semiconductor switching element drive circuit according to claim 1, further comprising:

a power supply configured to supply a voltage generated by at least any one of band gap reference and trimming to the logic circuit;

a first resistor electrically connected to a gate of the semiconductor switching element when a gate drive condition of the semiconductor switching element is the first gate drive condition;

a second resistor electrically connected to a gate of the semiconductor switching element when a gate drive condition of the semiconductor switching element is the second gate drive condition; and a speed-up capacitor connected in parallel with the first resistor;

wherein the switching circuit executes a gate sink function on the semiconductor switching element when a gate voltage of the semiconductor switching element is equal to or less than a predetermined threshold value after a gate drive condition of the semiconductor switching element is switched from the first gate drive condition to the second gate drive condition.

8. The semiconductor switching element drive circuit according to claim 1, wherein the semiconductor switching element includes an IGBT or a MOSFET containing silicon carbide.

9. A semiconductor device comprising:

a plurality of semiconductor switching elements each of which is the semiconductor switching element according to claim 1; and a plurality of gate drive circuits each of which is the semiconductor switching element drive circuit according to claim 1, wherein the plurality of gate drive circuits drive the plurality of respective semiconductor switching elements.

10. A semiconductor switching element drive circuit configured to drive a semiconductor switching element, the semiconductor switching element drive circuit comprising:

a voltage-dividing resistor configured to generate a divided voltage of an output voltage of the semiconductor switching element;

a logic circuit configured to invert a level of an output signal based on the divided voltage;

a switching circuit configured to switch a gate drive condition of the semiconductor switching element during a turn-off operation from a first gate drive condition in which a switching speed of the semiconductor switching element is a first switching speed to a second gate drive condition in which the switching speed is a second switching speed lower than the first switching speed based on the output signal from the logic circuit; and a timer configured to count a predetermined period equal to or longer than a period from a time point at which a gate drive condition of the semiconductor switching element is switched from the first gate drive condition to the second gate drive condition to a time point at which an output current of the semiconductor switching element becomes zero, wherein the switching circuit executes a gate sink function on the semiconductor switching element when the timer ends counting.

11. A semiconductor switching element drive circuit configured to drive a semiconductor switching element, the semiconductor switching element drive circuit comprising:

a voltage-dividing resistor configured to generate a divided voltage of an output voltage of the semiconductor switching element;

a logic circuit configured to invert a level of an output signal based on the divided voltage;

a switching circuit configured to switch a gate drive condition of the semiconductor switching element during a turn-off operation from a first gate drive condition in which a switching speed of the semiconductor switching element is a first switching speed to a second gate drive condition in which the switching speed is a second switching speed lower than the first switching speed based on the output signal from the logic circuit, wherein the switching circuit executes a gate sink function on the semiconductor switching element when a gate voltage of the semiconductor switching element is equal to or less than a predetermined threshold value after a gate drive condition of the semiconductor switching element is switched from the first gate drive condition to the second gate drive condition; and a cutoff circuit configured to cut off an input of the divided voltage to the logic circuit except for a period from when a turn-off operation of the semiconductor switching element is started until a gate voltage of the semiconductor switching element becomes equal to or less than the predetermined threshold value.

* * * * *